(12) United States Patent
Yamaguchi et al.

(10) Patent No.: US 7,733,320 B2
(45) Date of Patent: Jun. 8, 2010

(54) SHIFT REGISTER CIRCUIT AND DRIVE CONTROL APPARATUS

(75) Inventors: Ikuhiro Yamaguchi, Tokyo (JP); Katsuhiko Morosawa, Tachikawa (JP)

(73) Assignee: Casio Computer Co., Ltd., Tokyo (JP)

( * ) Notice: Subject to any disclaimer, the term of this patent is extended or adjusted under 35 U.S.C. 154(b) by 1094 days.

(21) Appl. No.: 11/372,419

(22) Filed: Mar. 9, 2006

(65) Prior Publication Data

US 2006/0210012 A1  Sep. 21, 2006

(30) Foreign Application Priority Data

Mar. 15, 2005  (JP)  ............... 2005-072710

(51) Int. Cl.
  *G09G 3/36*  (2006.01)
  *G09G 3/30*  (2006.01)
(52) U.S. Cl. .................... 345/100; 345/76; 377/64
(58) Field of Classification Search ............ 345/76–83, 345/87–104; 377/64, 68–81; 326/37, 46–49
See application file for complete search history.

(56) References Cited

U.S. PATENT DOCUMENTS

| 6,611,248 B2* | 8/2003 | Kanbara et al. ............. 345/100 |
| 6,845,140 B2* | 1/2005 | Moon et al. .................... 377/78 |
| 7,292,218 B2* | 11/2007 | Lin et al. .................... 345/100 |
| 7,298,084 B2* | 11/2007 | Baude et al. ................ 313/506 |
| 7,551,167 B2 | 6/2009 | Park et al. |
| 2002/0027545 A1 | 3/2002 | Park et al. |
| 2004/0150610 A1 | 8/2004 | Zebedee et al. |

FOREIGN PATENT DOCUMENTS

| DE | 4109237 A1 | 11/1992 |
| TW | 494381 B | 7/2002 |
| TW | 514926 B | 12/2002 |

OTHER PUBLICATIONS

Chinese Office Action (and English translation thereof) dated Jul. 4, 2008, issued in a counterpart Chinese Application.
Taiwanese Office Action dated Nov. 11, 2009 and English translation thereof issued in a counterpart Taiwanese Application No. 095108496.

* cited by examiner

*Primary Examiner*—Jimmy H Nguyen
(74) *Attorney, Agent, or Firm*—Frishauf, Holtz, Goodman & Chick, P.C.

(57) ABSTRACT

A shift register circuit includes a plurality of cascade-connected signal holding circuits each of the signal holding circuits includes an input control circuit to which an input signal is applied, and which fetches and holds the input signal, an output control circuit to which a first control clock signal is applied, and which outputs an output signal corresponding to timings of the held input signal and the first control clock signal, and a reset control circuit to which a reset signal is applied, and which initializes a signal level of the input signal held in the input control circuit. A timing at which the output signal is terminated is set to be ahead of an application start timing of the reset signal.

10 Claims, 13 Drawing Sheets

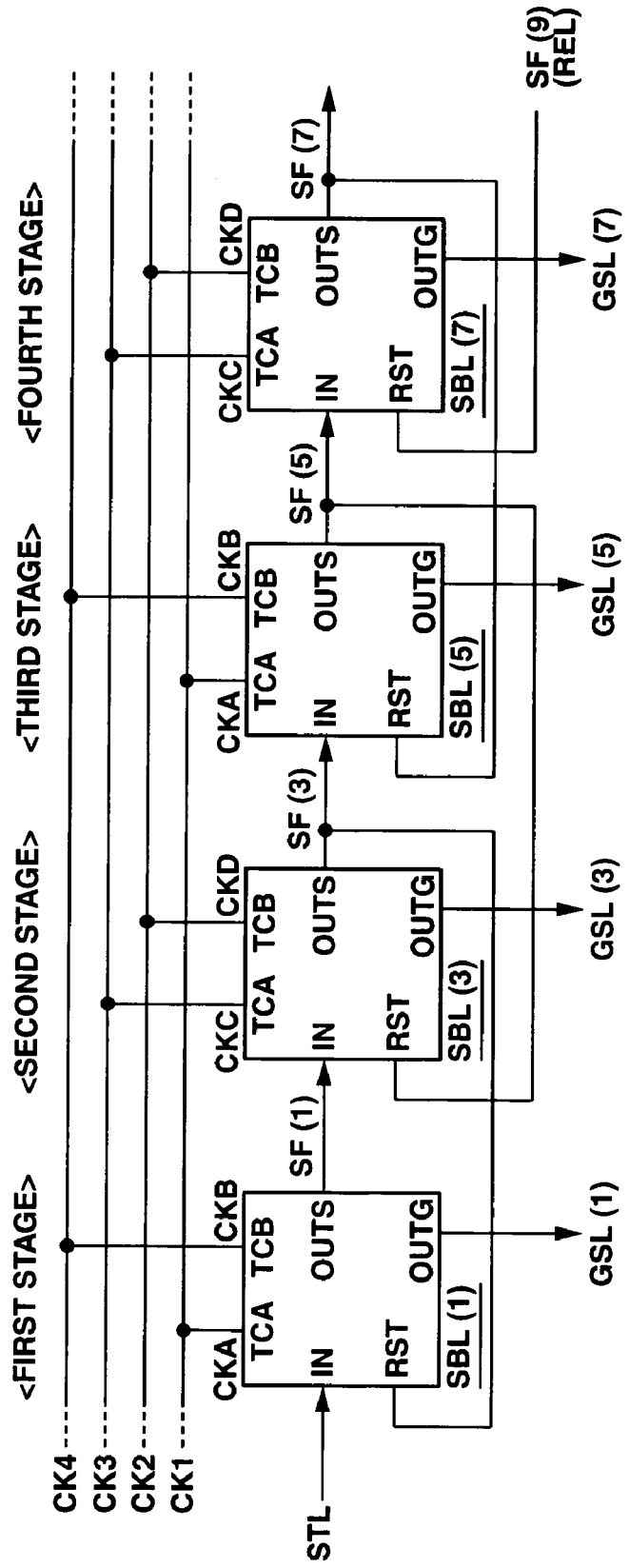

SHIFT REGISTER CIRCUIT AND DRIVE CONTROL APPARATUS

CROSS-REFERENCE TO RELATED APPLICATIONS

This application is based upon and claims the benefit of priority from prior Japanese Patent Application No. 2005-072710, filed Mar. 15, 2005, the entire contents of which are incorporated herein by reference.

BACKGROUND OF THE INVENTION

1. Field of the Invention

The present invention relates to a shift register circuit and a drive control apparatus, and more particularly to a shifter register circuit which can be excellently applied in a scanning driver of, e.g., an image display apparatus or an image read apparatus, and a drive control apparatus including this shift register circuit.

2. Description of the Related Art

In recent years, information devices such as a computer, a mobile phone or a personal digital assistance, or imaging devices such as a digital video camera, a digital still camera or a scanner have considerably gained in popularity. In such devices, an image display circuit for, e.g., a liquid crystal display panel or an image read circuit for, e.g., a photosensor array has been in heavy usage.

For example, an active matrix drive type liquid crystal display apparatus has a display panel in which display pixels (liquid crystal pixels) provided with pixel transistors each formed of a thin film transistor are arranged in a matrix form. The panel includes scanning lines through which the respective display pixels are connected in a row direction and data lines through which the same are connected in a column direction. In this apparatus, a scanning driver (a gate driver) is used to sequentially set the respective scanning lines to a selective state. A data driver is also used to apply a signal voltage corresponding to display data to the respective data lines. As a result, an alignment state of a liquid crystal in each display pixel set to the selective state is controlled, thereby display desired image information.

Here, the scanning driver is configured to generate and output a scanning signal which is used to sequentially set the respective scanning lines to the selective state, and is generally constituted of a shift register circuit.

There is also known an image read apparatus provided with a photosensor array in which photosensors (read pixels) are arranged in a matrix form the read apparatus also has a scanning driver which is used to sequentially set the photosensors in respective rows to a drive state (a selective state) at the time of an image read operation of the photosensor array. This apparatus is configured to read detection data (brightness data) corresponding to a light receiving quantity detected by each photosensor set to the drive state by a read driver, and acquire image information of an object. In such an image read apparatus, like the liquid crystal display apparatus mentioned above, the scanning driver is provided with a shift register circuit which generates and outputs a scanning signal which is used to sequentially set the photosensors in the respective rows to the drive state.

The scanning driver applied in the image display apparatus or the image read apparatus mentioned above will now be briefly described.

FIG. 13 is a structural view of a primary part showing an example of a scanning driver (a shift register circuit section) applied in a liquid crystal display apparatus according to a prior art.

The scanning driver applied in an image display apparatus (a liquid crystal display apparatus) has a configuration in which, e.g., a plurality of stages (shift blocks) SRC (q−1), SRC (q), SRC (q+1), . . . (q is an integer which is not smaller than 2) are cascade-connected as shown in this figure. The driver is provided with a shift register circuit section which sequentially inputs (transfer) an output signal from each stage SRC (q) to the next stage SRC (q+1). Here, the output signal from each stage SRC (q) is sequentially output as a scanning signal GOUT (k) to a scanning line in a corresponding row in accordance with the transfer operation (which converts a level of the output signal into a predetermined signal level), and inputs to a previous stage SCR (Q−1) as a reset signal.

In the scanning driver (the shift register circuit) shown in FIG. 1, reference characters CKV and CKVB denote clock signals having a mutual reversal relationship; STV, a shift start signal which is input to a non-illustrated first stage SRC (1); an END, a reset signal which is input to a last stage.

In the image display apparatus including such a scanning driver, according to a known display drive control method, since an operating frequency of the scanning driver can be generally set to be lower than that of a data driver, even a transistor element using a semiconductor material having relatively low electron mobility such as amorphous silicon or zinc oxide (ZnO) can be applied as a switching element constituting the scanning driver (the shift register circuit section).

In this case, when an element structure (a thin film transistor structure) using amorphous silicon or the like is applied to display pixels arranged in a display panel, these display pixels (the display panel) and a display drive device such as a scanning driver or a data driver which is a peripheral circuit can be integrally formed on a single panel substrate (a glass substrate or the like) by using the same manufacturing process. As a result, there has been studied/developed a technology which reduces a scale and a thickness of the apparatus and simplifies the manufacturing process to decrease a cost, for example.

As described above, in the thin film transistor element formed of a semiconductor material such as amorphous silicon or zinc oxide, its electron mobility is low and its operation characteristics are poor as compared with a thin film transistor element formed of a semiconductor material such as single-crystal silicon or polysilicon. However, in a case where this thin film transistor element is applied in the above-described image display apparatus or image read apparatus, it can be applied to a scanning driver which has an operating frequency lower than that of a data driver but has no problem in operation.

However, in the scanning driver to which an amorphous silicon transistor or the like is applied, since its operating frequency is essentially low, it is disadvantageously hard to be applied to a panel having a large number of scanning lines and a high operating frequency, e.g., a display panel having a high resolution or a large screen or a sensor array.

Specifically, it is generally known that an operating frequency (i.e., an operating speed) of the scanning driver is determined by a product (a time constant) of a resistance component (an output resistance) and a load carrying capacity of an output section of a scanning signal (i.e., an output section of each shift block (stage) constituting a shift register circuit). Here, the load carrying capacity is a sum of wiring capacities which are parasitic on the respective scanning lines, an input capacity in the next shift block and others, and the resistance component is an on resistance or the like of a switching element constituting the output section of the shift block.

As described above, when the thin film transistor such as an amorphous silicon transistor is applied in the scanning driver, a capacity component which serves as the load carrying capacity is large because of element characteristics, and an on resistance is low. Therefore, considerably reducing the operating frequency to be lower than that of the scanning driver to which a single-crystal silicon transistor is applied is unavoidable.

Further, the amorphous silicon transistor has characteristics that its manufacturing process is simple and uniform and excellent element characteristics can be obtained during manufacture, but deterioration in the element characteristics over time is larger than that in the single-crystal silicon transistor or the polysilicon transistor. Therefore, it has a problem that excellently performing display driving or read driving for a long time is difficult. Specifically, according to a verification by the present inventors, there has been obtained an experimental result that an operating frequency is reduced to approximately ½ of that in the initial state when an acceleration experiment is conducted for several-hundred hours in a temperature environment of approximately 80° C. There is a problem that excellent display driving or read driving cannot be assured in an actual product for a long period of time.

BRIEF SUMMARY OF THE INVENTION

The present invention has, in a shift register circuit which sequentially transfers an input signal and sequentially outputs an output signal and a drive control apparatus including this shift register circuit, an advantage that deterioration in characteristics during an operation can be suppressed and an output signal can be excellently output at a predetermined timing over a relatively long period even if a switching element having element characteristics that electron mobility is relatively low is applied in the shift register circuit.

In order to obtain this advantage, according to a first aspect of the present invention, there is provided a shift register circuit comprising a plurality of cascade-connected signal holding circuits, each of the signal holding circuits comprising: an input control circuit to which an input signal is applied and which fetches and holds the input signal; an output control circuit to which a first control clock signal is applied and which outputs an output signal corresponding to timings of the held input signal and the first control clock signal; and a reset control circuit to which a reset signal is applied and which initializes a signal level of the input signal held in the input control circuit, wherein a timing at which the output signal is terminated is set before an application start timing of the reset signal.

Preferably, each of the signal holding circuits further comprises a transfer control circuit to which a second control clock signal is applied and which outputs a shift signal corresponding to timings of the input signal held in the input control circuit and the second control clock signal and supplies the shift signal as the input signal to the signal holding circuit on the next stage. Furthermore, the shift signal generated by the transfer control circuit in the signal holding circuit on the next stage may be input as the reset signal in the reset control circuit, and the reset signal may be input at a timing which provides a reversal phase of the second control clock signal.

Each of the first control clock signal and the second control clock signal has preferably a first signal level and a second signal level. The output signal in the output control circuit may be output in accordance with a timing at which the first control clock signal is set to the first signal level. The signal level of the first control clock signal may be set to change to the second signal level prior to a start timing of an operation of initializing a signal level of the input signal held in the input control circuit by the reset control circuit.

For example, a signal width in which the first control clock signal changes to the first signal level is the same as a signal width in which the second control clock signal changes to the first signal level, and the first control clock signal is set to change from the first signal level to the second signal level prior to a timing at which the second control clock signal changes from the first signal level to the second signal level. Alternatively, a signal width in which the first control clock signal changes to the first signal level may be set shorter than a signal width in which the second control clock signal changes to the first signal level, and the first control clock signal is set to change from the first signal level to the second signal level prior to a timing at which the second control clock signal changes from the first signal level to the second signal level.

The first control clock signal and the second control clock signal may be supplied to the signal holding circuits on odd-numbered stages of the signal holding circuits on the plurality of stages, and a third control clock signal and a fourth control clock signal respectively having phases reversed from those of the first control clock signal and the second control clock signal may be supplied to the signal holding circuits on even-numbered stages of the same.

The input control circuit is preferably provided with at least a first switch circuit which has one end side of a current path and a control terminal to which the input signal is supplied and the other end side connected with a first contact point. The output control circuit is preferably provided with at least: a second switch circuit which has one end side of a current path to which the first control clock signal is supplied, the other end side connected with a second contact point from which the output signal is output and a control terminal connected with the first contact point; and a third switch circuit which has one end side of a current path connected with the power supply voltage, the other end side connected with the second contact point a control terminal to which a reversal potential of a potential of the first contact point is applied. The reset control circuit may be provided with at least a fourth switch circuit which has one end side of a current path connected with the first contact point, the other end side connected with the power supply voltage and a control terminal to which the reset signal is supplied. The transfer control circuit may be provided with at least: a fifth switch circuit which has one end side of a current path to which the second control clock signal is supplied, the other end side connected with a third contact point which outputs the shift signal and a control terminal connected with the first contact point; and a sixth switch circuit which has one end side of a current path connected with a predetermined power supply voltage, the other end side connected with the third contract point and a control terminal to which a reversal potential of the potential of the first contact point is applied.

In the output control circuit, at least the second switch circuit may be turned on only in an output period of the output signal, the output signal is output through the second contact point. In a non-output period of the output signal, the third switch circuit may be turned on, and the output signal may be output through the second contact point.

Each of the signal holding circuits is preferably configured to comprise a plurality of switch circuits each formed of a field-effect type transistor having a single channel polarity, and the field-effect transistor is a thin film transistor using a semiconductor material consisting of amorphous silicon or a thin film transistor using a semiconductor material consisting of zinc oxide, for example.

In order to obtain the above-described advantage, according to a second aspect of the present invention, there is provided a drive control apparatus which sequentially outputs a scanning signal which sets pixels in each row in a pixel array in which the plurality of pixels are two-dimensionally arranged to a selective state, the drive control apparatus comprising a shift register circuit constituted of a plurality of cascade-connected signal holding circuits, each of the signal holding circuits comprising: an input control circuit to which an input signal is applied and which fetches and holds the input signal; an output control circuit to which a first control clock signal is applied and which outputs an output signal serving as the scanning signal corresponding to timings of the held input signal and the first control clock signal; and a reset control circuit to which a reset signal is applied and which initializes a signal level of the input signal held in the input control circuit, wherein a timing at which the output signal is terminated is set prior to a an application start timing of the reset signal.

Preferably, the drive control apparatus comprising: a first drive control section which sequentially outputs the scanning signal to the pixels in odd-numbered rows in the pixel array; and a second drive control section which sequentially outputs the scanning signal to the pixels in even-numbered rows in the pixel array.

Preferably, each of the signal holding circuits further comprises a transfer control circuit to which a second control clock signal is applied, and which outputs a shift signal corresponding to timings of the input signal held in the input control circuit and the second control clock signal and supplies the shift signal as the input signal to the signal holding circuit on the next stage. Moreover, the shift signal generated by the transfer control circuit in the signal holding circuit on the next stage may be input as the reset signal in the reset control circuit.

Each of the first control clock signal and the second control clock signal has preferably a first signal level and a second signal level. The output signal in the output control circuit may be output in accordance with a timing at which the first control clock signal is set to the first signal level. The signal level of the first control clock signal may be set to change to the second signal level prior to a timing of starting an operation which initializes a signal level of the input signal held in the input control circuit by the reset control circuit.

For example, a signal width in which the first control clock signal changes to the first signal level is the same as a signal width in which the second control clock signal changes to the first signal level. The first control clock signal is set to change from the first signal level to the second signal level prior to a timing at which the second control clock signal changes from the first signal level to the second signal level. Alternatively, a signal width in which the first control clock signal changes to the first signal level may be set shorter than a signal width in which the second control clock signal changes to the first signal level. The first control clock signal may be set to change from the first signal level to the second signal level prior to a timing at which the second control clock signal changes from the first signal level to the second signal level.

The first control clock signal and the second control clock signal are preferably supplied to the signal holding circuits on odd-numbered stages of the signal holding circuits on the plurality of stages. A third control clock signal and a fourth control clock signal which respectively provide reversal phases of those the first control clock signal and the second control clock signal are preferably supplied to the signal holding circuits on even-numbered stages of the same.

Each of the signal holding circuits may be configured to comprise a plurality of switch circuits each formed of a field-effect type transistor having a single channel polarity. Each of the plurality of pixels may be configured to comprise a switch circuit constituted of at least one field-effect type transistor having a single channel polarity. The drive control apparatus is integrally provided on a substrate where the pixel array is formed.

The field-effect type transistor constituting the pixel array and the drive control apparatus is, e.g., a thin film transistor using a semiconductor material consisting of amorphous silicon or a thin film transistor using a semiconductor material consisting of zinc oxide.

The pixel array may be a display pixel array in which a plurality of display pixels are two-dimensionally arranged or a read pixel array in which a plurality of read pixels are two-dimensionally arranged.

BRIEF DESCRIPTION OF THE SEVERAL VIEWS OF THE DRAWING

FIG. 7 is a schematic structural view showing an example of a shift register circuit of an odd-numbered line scanning driver in the image display apparatus according to the first application example;

DETAILED DESCRIPTION OF THE INVENTION

A shift register circuit, a drive control method thereof and a drive control apparatus including this shift register circuit according to the present invention will now be described hereinafter with reference to the accompanying drawings.

<Shift Register Circuit>

An entire configuration of a shift register circuit according to the present invention will be first described with reference to the accompanying drawings.

Figure 1:
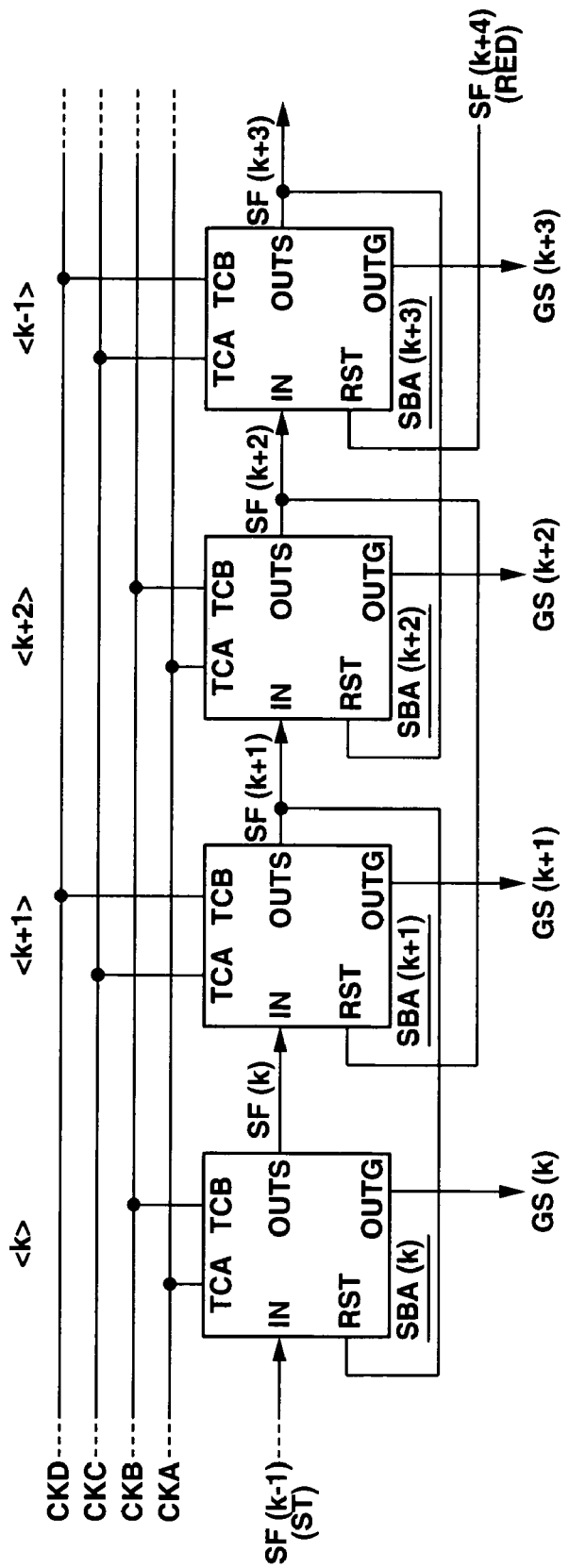
FIG. 1 is a schematic structural view showing an embodiment of a shift register circuit according to the present invention.

FIG. 1 is a schematic structural view showing an embodiment of a shift register circuit according to the present invention.

Here, shift blocks on four stages only, i.e., a <k>th stage to a <k+3>th stage (1≦k, k+3≦n) in shift blocks on a plurality of stages (n stages; n is an integer which is not smaller than 4) constituting the shift register circuit are illustrated for the convenience's sake, and a description will be mainly given on a shift block on the <k>th stage.

As shown in FIG. 1, the shift register circuit according to this embodiment is provided with shift blocks (signal holding circuits) SBA (1) to SBA (n) on a plurality of stages, and an output signal output from an output terminal OUTS of a shift block SBA (k−1) on a previous stage is input as a shift signal (an input signal) SF (k−1) to an input terminal IN of a shift block SBA (k) on each stage. When the shift block SBA (k) is a shift block SBA (1) on a first stage, a start signal (an input signal) ST is supplied from the outside.

An output signal output from the output terminal OUTS of this shift block SBA (k) is sequentially input to an input terminal IN on the next stage as a shift signal SF (k), and an output signal output from an output terminal OUTG is fetched as an external output signal (an output signal) GS (k).

Further, each shift block SBA (k) is provided with a reset terminal RST to which a shift signal SF (k+1) output from an output terminal OUTS of a shift block SBA (k+1) on the next stage as a reset signal (a reset signal RED is externally supplied when the shift block SBA (k) is a shift block SBA (n) on a last stage).

Furthermore, the respective shift blocks SBA (1) to SBA (n) are provided with clock terminals TCA and TCB to which two types (two phases) of control clock signals CKA and CKB or CKC and CKD having different phases are individually supplied in accordance with the step number (which stage) of a corresponding shift block SBA (k).

Specifically, for example, in the shift block SBA (k) on an odd-numbered stage, the control clock signal CKA is supplied to the clock terminal TCA and the control clock signal CKB is supplied to the clock terminal TCB. On the other hand, in the shift block SBA (k+1) on an even-numbered stage, the control clock signal CKC is supplied to the clock terminal TCA and the control clock signal CKD is supplied to the clock terminal TCB.

Here, the control clock signals CKA and CKC are set in such manner that their phases have a reversal relationship, and the control clock signals CKB and CKD are set in such a manner that their phases have a reversal relationship. A phase difference or rising and falling timings of the control clock signals will be explained in detail in a later-described drive control method.

(Circuit Configuration of Shift Block)

A concrete circuit configuration of each shift block applied in the shift register circuit according to this embodiment will now be described with reference to the accompanying drawings.

Figure 2:
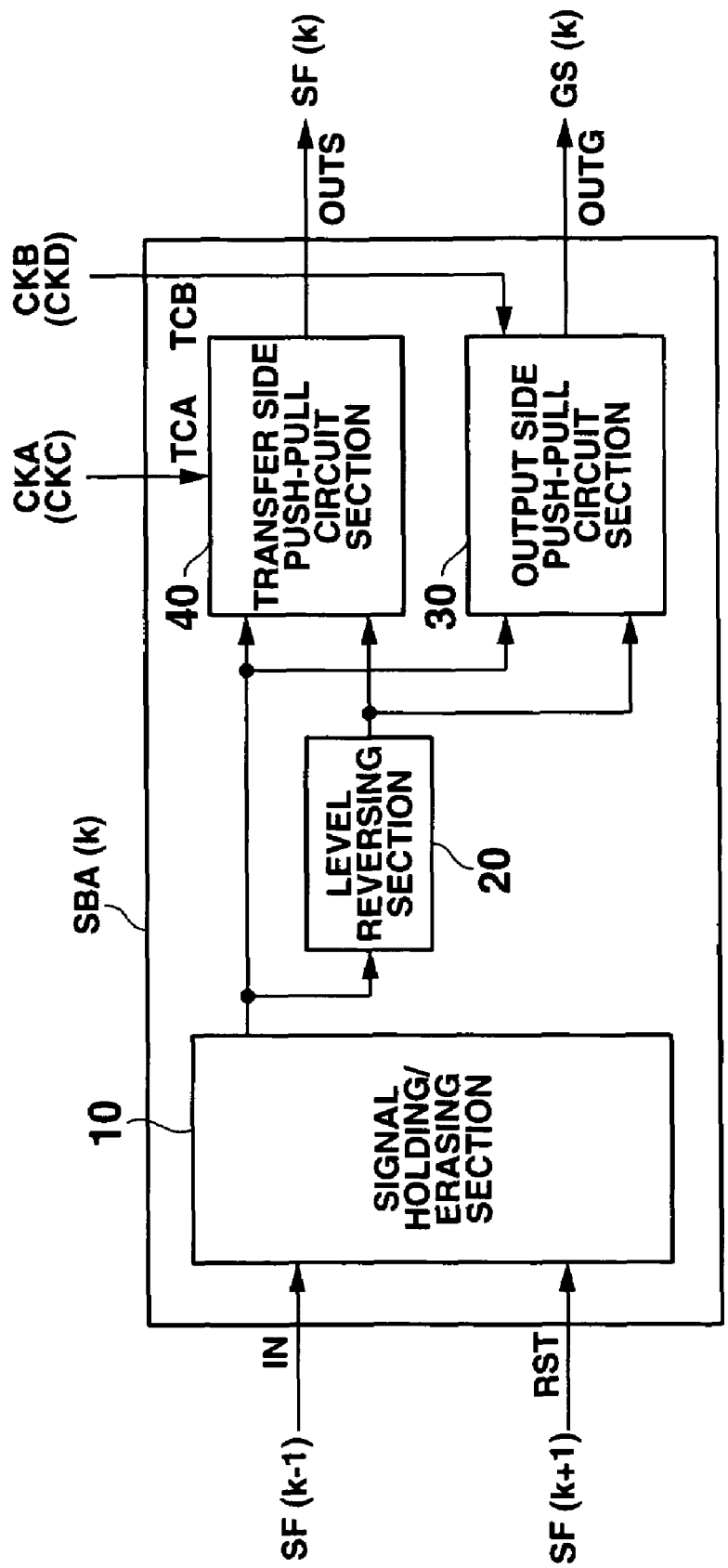
FIG. 2 is a functional block diagram showing an example of a shift block applied in the shift register circuit according to an embodiment.

FIG. 2 is a functional block diagram showing an example of a shift block applied in the shift register circuit according to this embodiment.

Figure 3:
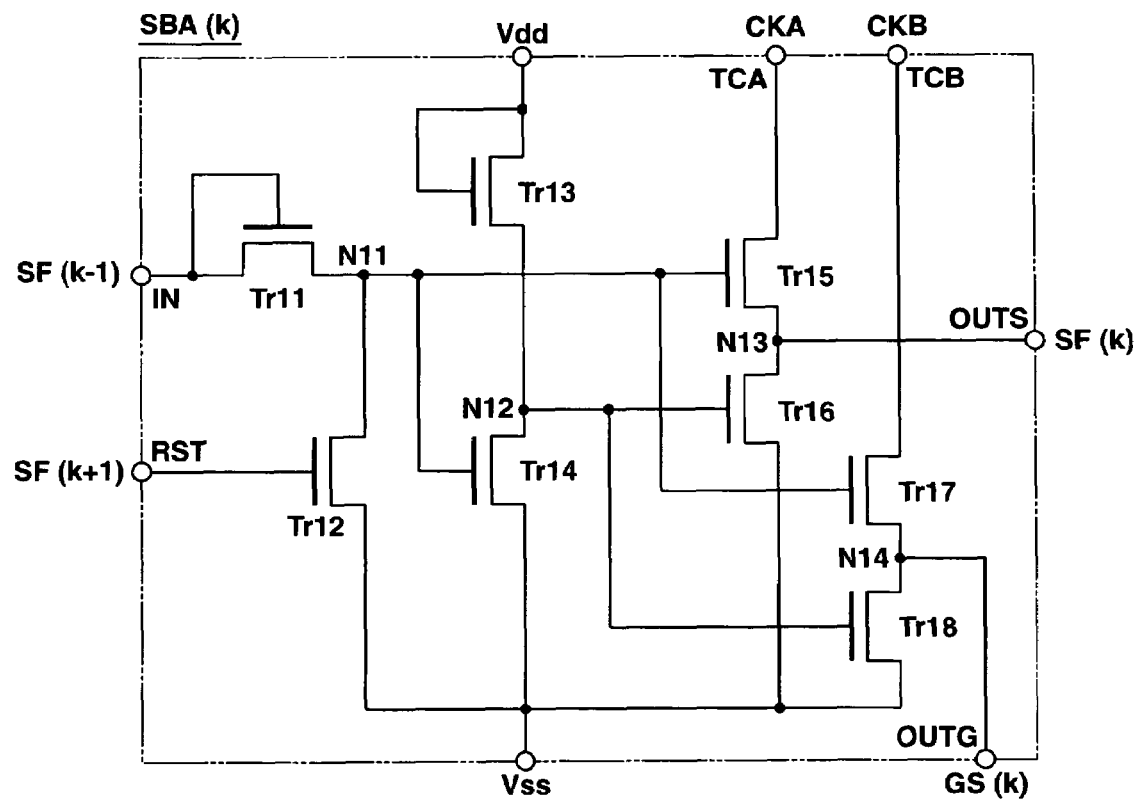
FIG. 3 is a concrete circuit structural view showing the shift block applied in the shift register circuit according to the embodiment.

FIG. 3 is a concrete circuit structural view of the shift block applied in the shift register circuit according to this embodiment.

The shift block on the odd-numbered stage and the shift block on the even-numbered block are set to have a relationship in which phases of the control clock signals supplied thereto are reversed from each other, and have the same circuit configuration. Therefore, in this example, a description will be given on the shift block on the <k>th stage as an example of the shift block on the odd-numbered stage which operates based on the control clock signals CKA and CKB. Therefore, in the shift block on the even-numbered stage, as shown in FIG. 2, the control clock signals CKA and CKB are respectively regarded as the control clock signals CKC and CKD.

As shown in FIG. 2, the shift block SBA (k) according to this embodiment is generally provided with a signal holding/erasing section (an input control circuit, a reset control circuit) 10, a level reversing section 20, an output side push-pull circuit section 30, and a transfer side push-pull circuit section 40. The first section 10 fetches and holds a shift signal SF (k−1) based on the shift signal SF (k−1) which is input to the input terminal IN from the non-illustrated shift block SBA (k−1) on the previous stage, and erases (resets a signal level) of the held shift signal SF (k−1) based on a shift signal SF (k+1) input to the reset terminal RST from the non-illustrated shift block SBA (k+1) on the next stage. The second section 20 reverses a signal level based on the shift signal SF (k−1) held in the signal holding/erasing section 10. The third section 30 is an output control circuit which generates an external output signal GS (k) based on a non-reversal signal level and a reversal signal level of the shift signal SF (k−1) and a control clock signal (a first control clock signal) CKB, and outputs the generated signal through the output terminal OUTG. The fourth section 40 is a transfer control circuit which generates a shift signal SF (k) based on a signal level (the non-reversal signal level) of the shift signal SF (k−1) held in the signal holding/erasing section 10, a signal level (a reversal signal level) reversed by the level reversing section 20 and a control clock signal (a second control clock signal) CKA, and outputs the generated signal to the shift block SBA (k+1) on the next stage through the output terminal OUTS.

Specifically, for example, as shown in FIG. 3, the shift block SBA (k) can be constituted by using eight thin film transistors (field-effect type transistors) Tr11 to Tr18. That is, the signal holding/erasing section 10 is configured to have: a thin film transistor (a first switch circuit) Tr11 having a gate terminal and a drain terminal connected with the input terminal IN and a source terminal connected with a contact point N11 (a first contact point); and a thin film transistor (a fourth switch circuit) Tr12 having a gate terminal connected with the reset terminal RST, a source terminal connected with the contact point N11 and a drain terminal connected with a low-potential voltage (a power supply voltage) Vss.

The level reversing section 20 is configured to have: a thin film transistor Tr13 having a gate terminal and a drain terminal connected with a high-potential voltage Vdd and a source terminal connected with a contact point N12; and a thin film transistor Tr14 having a gate terminal connected with the contact point N11 and a drain terminal and a source terminal respectively connected with the contact point N12 and the low-potential voltage Vss.

The output side push-pull circuit section 30 is configured to have: a thin film transistor (a second switch circuit) Tr17 having a gate terminal connected with the contact point N11 and a drain terminal and a source terminal respectively connected with a clock terminal TCB and a contact point N14 (the output terminal OUTG; a second contact point); and a thin film transistor (a third switch circuit) Tr18 having a gate terminal connected with the contact point N12 and a drain terminal and a source terminal respectively connected with the contact point N14 and the low-potential voltage Vss.

The transfer side push-pull circuit section 40 is configured to have: a thin film transistor (a fifth switch circuit) Tr15 having a gate terminal connected with the contact point N11 and a drain terminal and a source terminal respectively connected with a clock terminal TCA and a contact point N13 (the output terminal OUTS; a third contact point); and a thin film transistor (a sixth switch circuit) Tr16 having a gate terminal connected with the contact point N12 and a drain terminal and a source terminal respectively connected with the contact point N13 and the low-potential voltage Vss.

As described above, the shift block SBA (k) according to this embodiment is configured to include in an output section the output side push-pull circuit section 30 for scanning (the scanning signal output) which outputs the external output signal GS (k) at a timing based on the control clock signal CKB and the transfer side push-pull circuit section 40 for transfer (the transfer signal output) which outputs the shift signal SF (k) to the shift block SBA (k+1) on the next stage at a timing based on the control clock signal CKA.

Here, as the thin film transistors Tr11 to Tr18 constituting the above-described shift block SBA (k), it is possible to apply a thin film transistor which is of the same channel type (an n-channel type in this example) formed on an insulative substrate. As such a thin film transistor, it is possible to apply, e.g., a thin film transistor formed of a semiconductor material such as amorphous silicon or zinc oxide. As a result, the thin film transistor having uniform element characteristics can be formed by applying a manufacturing process using an already established manufacturing technology, thereby realizing the shift register circuit which is superior in operation characteristics at a relatively low cost.

(Drive Control Method of Shift Register Circuit)

A drive control operation (a drive control method) of the thus configured shift register circuit will now be described.

Figure 4:
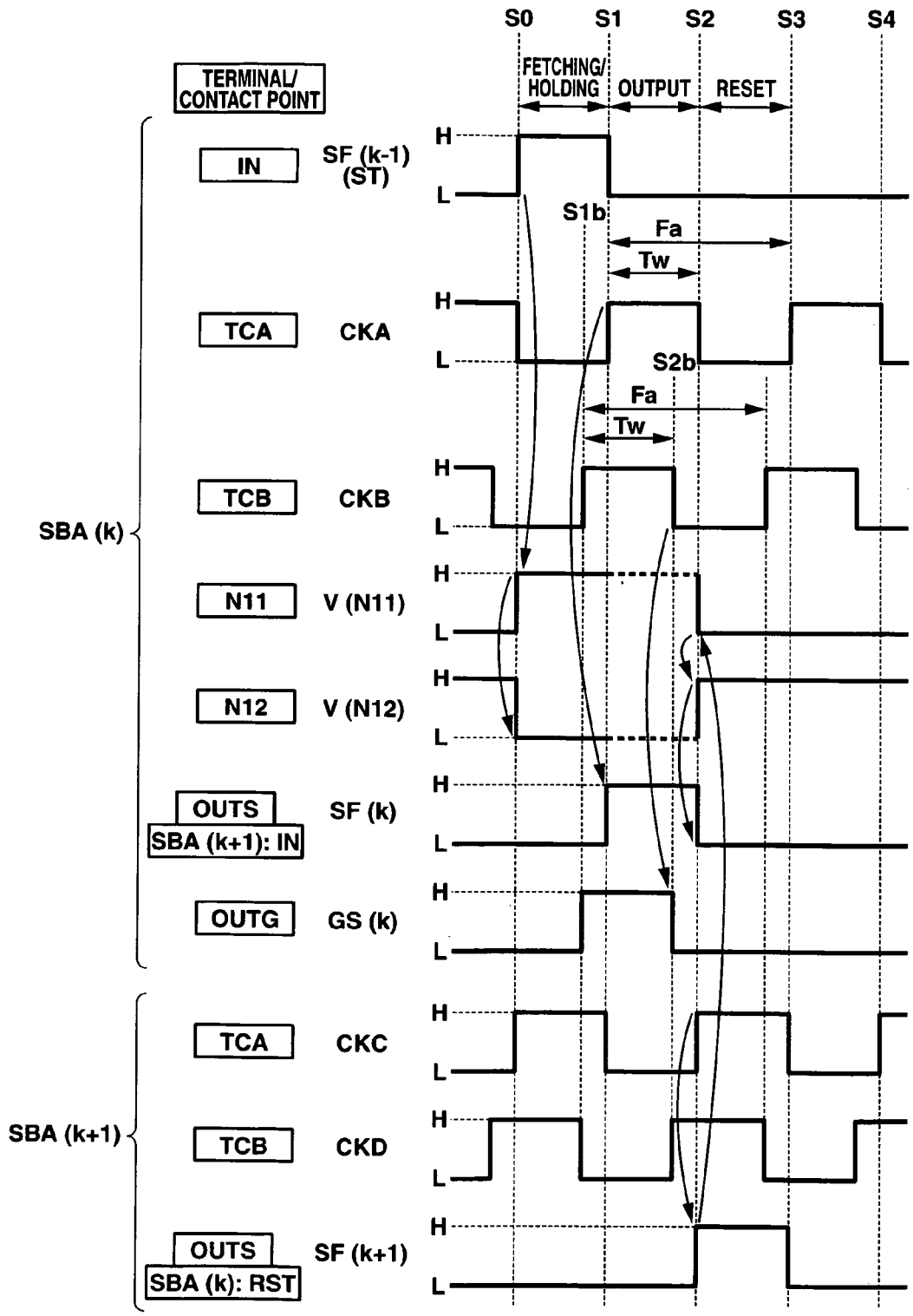
FIG. 4 is a timing chart showing a drive control operation of the shift block applied in the shift register circuit according to the embodiment.

FIG. 4 is a timing chart showing a drive control operation of a shift block applied in the shift register circuit according to this embodiment.

As shown in FIG. 4, a drive control operation of each shift block SBA (k) according to this embodiment roughly has: a signal fetching/holding operation (a fetching/holding operation period <S0> to <S1>) which fetches and holds a shift signal SF (k−1) (or a start signal ST) output from the shift block SBA (k−1) on the previous stage; a signal output operation (an output operation period <S1> to <S2>) which generates a shift signal SF (k) having a predetermined signal level based on the shift signal SF (k−1) and outputs the generated signal to the shift block SBA (k+1) on the next stage; and a signal reset operation (a reset operation period <S2> to <S3>) which resets (initializes to a low-level state) the fetched and held signal level based on the shift signal SF (k+1) output from the shift block SBA (k+1) on the next stage, and is configured to sequentially execute these operations.

Here, the generation/output operation of the external output signal GS (k) is set in such a manner that a part of this operation period overlaps at least the output operation period of the shift signal SF (k) in terms of time as will be described later.

A description will now be given as to a concrete drive control operation of each shift block SBA (k) with the control clock signal CKA having a predetermined signal width Tw and signal cycle Fa (=2×Tw) shown in FIG. 4 being determined as a reference.

a) Signal Fetching/Holding Operation (Fetching/Holding Operation Period <S0> to <S1>)

In the signal fetching/holding operation, first, it is assumed that the circuit configuration shown in FIG. 3 is in a predetermined initial state. In this initial stage, at least a potential V (N11) at the contact point N11 is set to a low level (L), and the shift signal SF (k+1) output from the shift block SBA (k+1) on the next stage is set to the low level and applied to the reset terminal RST.

In this stage, the high-level (H) shift signal SF (k−1) (or the start signal ST) output from the shift block SBA (k−1) on the previous stage is applied to the input terminal IN, whereby the thin film transistor Tr11 constituting the signal holding/erasing section 10 is turned on.

Here, in the initial state, since the shift signal SF (k+1) is set to the low level, the thin film transistor Tr12 is turned off. On the other hand, since the potential V (N11) at the contact point N11 is set to the low level, the thin film transistors Tr14, Tr15 and Tr17 are turned off, and the thin film transistors Tr13, Tr16 and Tr18 are turned on, whereby the shift signal SF (k) and the external output signal GS (k) are set to the low level irrespective of signal levels of the control clock signals CKA and CKB.

As a result, the shift signal SF (k−1) is fetched to the contact point N11 through the thin film transistor Tr11, and thus the potential V (N11) at the contact point N11 changes to the high-level state corresponding to the signal level of the shift signal SF (k−1). Additionally, the thin film transistor Tr14 constituting the level reversing section 20 is turned on, whereby a potential V (N12) at the contact point N12 changes to the low-level state corresponding to the low-potential voltage Vss.

Therefore, the thin film transistor Tr15 constituting the transfer side push-pull circuit section 40 and the thin film transistor Tr17 constituting the output side push-pull circuit section 30 are turned on, and the thin film transistor Tr16 constituting the transfer side push-pull circuit section 40 and the thin film transistor Tr18 constituting the output side push-pull circuit section 30 are turned off. Therefore, potentials V (N13) and V (N14) at the contact points N13 and N14 are set in accordance with signal levels of the control clock signals CKA and CKB.

Here, in the initial stage of the fetching/holding operation period (<S0> to <S1b>), both the control clock signals CKA and CKB are set to the low level. Therefore, the low-level shift signal SF (k) is output to the shift block SBA (k+1) on the next stage through the output terminal OUTS, and the low-level external output signal GS (k) is output through the output terminal OUTG.

In the drive control operation of the shift block according to this embodiment, the control clock signals CKA and CKB are set to have the same signal width Tw and signal cycle Fa. Further, on a final stage of this fetching/holding operation period <S0> to <S1>, when the control clock signal CKB rises to the high level at a timing <S1b> which is ahead of the control clock signal CKA, the present state shifts to a signal output state in which the high-level external output signal GS (k) is output through the thin film transistor Tr17 constituting the output side push-pull circuit section 30 and the output terminal OUTG.

That is, in the fetching/holding operation period <S0> to <S1>, the low-level shift signal SF (k) alone is output from the output terminal OUTS during a period of a timing <S0> to <S1>, the low-level external output signal GS (k) is output from the output terminal OUTG during a period of a timing <S0> to <S1b> alone, and the high-level external output signal GS (k) is output during a period of a timing <S1b> to <S1>.

b) Signal Output Operation (Output Operation Period <S1> to <S2>)

Then, in a signal output operation, the shift signal SF (k−1) which is applied to the input terminal IN is set to the low level (supply is interrupted) in synchronization with a timing <S1> at which the control clock signal CKA changes to the high level, and the thin film transistor Tr11 is thereby turned off. As a result, the potential V (N11) at the contact point N 11 is maintained on the high-level side, and the potential V (N12) at the contact point N12 is maintained on the low-level side. As a result, like the fetching/holding operation period, the thin film transistors Tr15 and Tr17 keep the on state, and the thin film transistors Tr16 and Tr18 keep the off state.

Here, on an initial stage (<S1> to <S2b>) of the output operation period, since both the control clock signals CKA and CKB are set to the high level, the high-level shift signal SF (k) is output through the thin film transistor Tr15 constituting the transfer side push-pull circuit section 40 and the output terminal OUTS, and the high-level external output signal GS (k) is output through the thin film transistor Tr17 constituting the output side push-pull circuit section 30 and the output terminal OUTG.

As a result, the high-level shift signal SF (k) is applied to the input terminal IN of the non-illustrated shift block SBA (k+1) on the next stage, this signal level is fetched and held in the shift block SBA (k+1) on the next stage like the signal fetching/holding operation (the fetching/holding operation period), and the control clock signal (the third control clock signal) CKC is set to the high level in an output operation period (corresponding to a later-described reset operation period of the shift block SBA (k)) of the shift block SBA (k+1). Consequently, a high-level shift signal SF (k+1) is generated and output. This shift signal SF (k+1) is applied to the reset terminal RST of the shift block SBA (k) as a reset signal in the later-described reset operation period.

Further, in the drive control operation of the shift block according to this embodiment, especially in this output operation period <S1> to <S2>, the control clock signal CKB falls to the low level (the second signal level) at a timing <S2b> ahead of the control clock signal CKA, whereby the external output signal GS (k) is set to the low level at the timing <S2b>.

That is, in the output operation period, the high-level shift signal SF (k) alone is output from the output terminal OUTS in the period of the timing <S1> to <S2>, the high-level (the first signal level) external output signal GS (k) is output from the output terminal OUTG in the period of the timing <S1> to <S2b> alone, and the low-level external output signal GS (k) is output in the period of the timing <S2b> to <S2>. In other words, the output operation of the shift signal SF (k) is executed during the period of the timing <S1> to <S2>, and the output operation of the external output signal GS (k) is performed during the operation of the timing <S1b> to <S2b>.

c) Signal Reset Operation (Reset Operation Period <S2> to <S3>)

Then, in a signal reset operation, the control clock signal CKC which is supplied to the clock terminal TCA of the shift block SBA (k+1) on the next stage rises to the high level in synchronization with the timing <S2> at which the control clock signal CKA falls to the low level. As a result, a high-level shift signal SF (k+1) is output from the output terminal OUTS of the shift block SBA (k+1), and applied as a reset signal to the reset terminal RST of the shift block SBA (k).

Consequently, the thin film transistor Tr11 maintains the off state, and the thin film transistor Tr12 is turned on, whereby the potential V (N11) at the contact point N11 changes to the low level state corresponding to the low-potential voltage Vss. Furthermore, the thin film transistor Tr14 constituting the level reversing section 20 is turned off, and the potential V (N12) at the contact point N12 thereby changes to the high level state corresponding to the high-potential voltage Vdd.

Therefore, the thin film transistor Tr15 constituting the transfer side push-pull circuit section 40 and the thin film transistor Tr17 constituting the output side push-pull circuit section 30 are turned off, and the thin film transistor Tr16 constituting the transfer side push-pull circuit section 40 and the thin film transistor Tr18 constituting the output side push-pull circuit section 30 are turned on. As a result, potentials V (N13) and V (N14) at the contact points N13 and N14 are set to the low-level state corresponding to the low-potential voltage Vss, a low-level shift signal SF (k) is output through the output terminal OUTS, and a low-level external output signal GS (k) is output through the output terminal OUTG.

That is, the shift signal SF (k) output from the output terminal. OUTS is set to the low level after the timing <S2>, and the external output signal GS (k) output from the output terminal OUTG is set to the low level after the timing <S2b> in the output operation period <S1> to <S2>.

In this manner, the control clock signal CKB is changed to the low level and the external output signal GS (k) is changed to the low level through the thin film transistor Tr17 constituting the output side push-pull circuit section 30 prior to a timing at which a shift signal SF (k+1) of the shift block SBA (k+1) on the next stage as a rest signal rises to the high level (that is, a start timing <S2> of a reset operation period executed in synchronization with falling of the control clock signal CKA). As a result, signal characteristics (falling characteristics) at the time of falling of the external output signal GS (k) can be suppressed from being affected by deterioration in element characteristics of the thin film transistor Tr18 constituting the output side push-pull circuit section 30.

More specifically, verifying a case where falling timings of the control clock signals CKA and CKB (or the control clock signals CKC and CKD (the fourth control clock signal)) are set to be equal (or constituted of a signal control clock signal) and the shift signal SF (k) and the external output signal GS (k) are simultaneously output, a falling operation of the external output signal GS (k) is controlled by an on/off operation of the thin film transistor Tr18 constituting the output side push-pull circuit section 30.

Here, the thin film transistor Tr18 enters the off state in a short period where the high-level external output signal GS (k) is output. In any other period, the on state of the thin film transistor Tr18 is maintained for a long time (the on operation period is very long) in order to output the low-level external output signal GS (k) (or not to output the external output signal GS (k)). Therefore, element characteristics of the thin film transistor Tr18 are apt to be deteriorated with time.

Accordingly, when an on resistance of the thin film transistor Tr18 is increased due to deterioration in the element characteristics, the low-potential voltage Vss cannot be rapidly applied to the contact point N14 (the output terminal OUTG) at a timing where the external output signal GS (k) is changed from the high level to the low level (at the time of falling). A signal waveform when the external output signal GS (k) falls becomes dull, and a phenomenon that the signal level is not sufficiently lowered to the low-potential voltage Vss (the low level) or a phenomenon that the signal is delayed occurs. As a result, there is a problem that a display interference that an original display tone is shifted is produced due to so-called cross talk or a phenomenon that a part of a tone signal (display data) in an adjacent row is written.

On the contrary, in the configuration according to the present invention, the individual control clock signals CKB and CKA (or the control clock signals CKD and CKC) are respectively supplied to the output side push-pull circuit section 30 which generates and outputs the external output signal GS (k) and the transfer side push-pull circuit section 40 which generates and outputs the scanning signal SF (k). Further, the falling timing of the control clock signal CKB (or the control clock signal CKD) which controls a signal level of the external output signal GS (k) is set to be ahead of the signal reset operation start timing <S2> (the timing <S2b>). Here, as shown in FIG. 4, the signal reset operation start timing <S2> is a rising timing of the shift signal SF (k+1) as a reset signal, and also a rising timing of the control clock signal CKC or a falling timing of the control clock signal CKA having a reversal relationship with the control clock signal CKC.

According to this configuration, the falling operation of the external output signal GS (k) is controlled by the thin film transistor Tr17 to which the control clock signal CKB is supplied rather than the thin film transistor Tr18 constituting the output side push-pull circuit 30. Furthermore, the thin film transistor Tr17 enters the on state in a short period alone where the high-level external output signal GS (k) is output. In any other period, this transistor maintains the off state for a long time (the on operation period is very short). Therefore, deterioration in element characteristics is hard to be generated with time as compared with the above-described thin film transistor Tr18.

Therefore, even after the shift register circuit is driven for a long time, a state in which the on resistance of the thin film transistor Tr17 is relatively low is maintained. Therefore, the external output signal GS (k) rapidly falls to the low-level with falling of the control clock signal CKB (or the control clock signal CKD), thereby suppressing deterioration in signal characteristics. As a result, even an amorphous silicon transistor or the like which has low electron mobility and element characteristics which relatively considerably vary with time can be excellently applied to each of the thin film transistors Tr11 to Tr18 of the shift block SBA (k).

Moreover, when a series of drive control operations in each shift block SBA (k) described above are executed in such a manner that the output operation period and the fetching/holding operation period are synchronized with each other between the shift blocks adjacent to each other, it is possible to realize the shift register circuit which can sequentially transfer (shift) the shift signal SF (k) between the respective shift blocks SBA (k) based on the signal cycles of the control clock signals CKC and CKD and sequentially output the excellent external output signal GS (k).

In this embodiment, the description has been given as to the example where the control clock signals CKA and CKB (or the control clock signals CKC and CKD) are determined as pulse signals having the same signal width Tw and phases are shifted and set so that the rising and falling timings of the control clock signal CKB (or the control clock signal CKD) are set to be ahead of the rising and falling timings (that is, an input timing of the high-level reset signal) of the control clock signal CKA (or the control clock signal CKC). However, the present invention is not restricted thereto, and the control clock signals CKA and CKB (or the control clock signals CKC and CKD) may be set to have different signal widths.

In brief, a technical concept of the present invention is intended to suppress deterioration in falling characteristics of the external output signal, and it is good enough to set at least the falling timing of the control clock signal CKB (or the control clock signal CKD) to be ahead of the signal reset operation start timing (that is, an output timing of the shift signal SF (k+1) from the shift block SBA (k+1) on the next stage; the rising timing of the control clock signal CKC). Therefore, for example, the signal width of the control clock signal CKB (or the control clock signal CKD) may be set narrower (the high-level period may be set shorter) than the signal width of the control clock signal CKA (or the control clock signal CKC). As a result, the output period of the external output signal GS (k) can be reduced, thereby decreasing a power consumption of the shift register circuit.

In this embodiment, although the description has been given as to the example where an n-channel type thin film transistor is applied as the thin film transistor constituting each shift block in the shift register circuit. However, the present invention is not restricted thereto, and it may have a configuration in which a p-channel type thin film transistor is applied to all the thin film transistors. In this case, the control clock signals CKA to CKD, the start signal ST, the shift signal SF (k) and the external output signal GS (k) supplied to each shift block in the shift register circuit are all set to signal levels obtained by reversing the high level and the low level.

Application examples of the shift register circuit according to this embodiment will now be described in detail with reference to the accompanying drawings. A description will be given as to a structural example of an image display apparatus to which the shift register circuit having the above-mentioned configuration can be applied.

First Application Example

Figure 5:
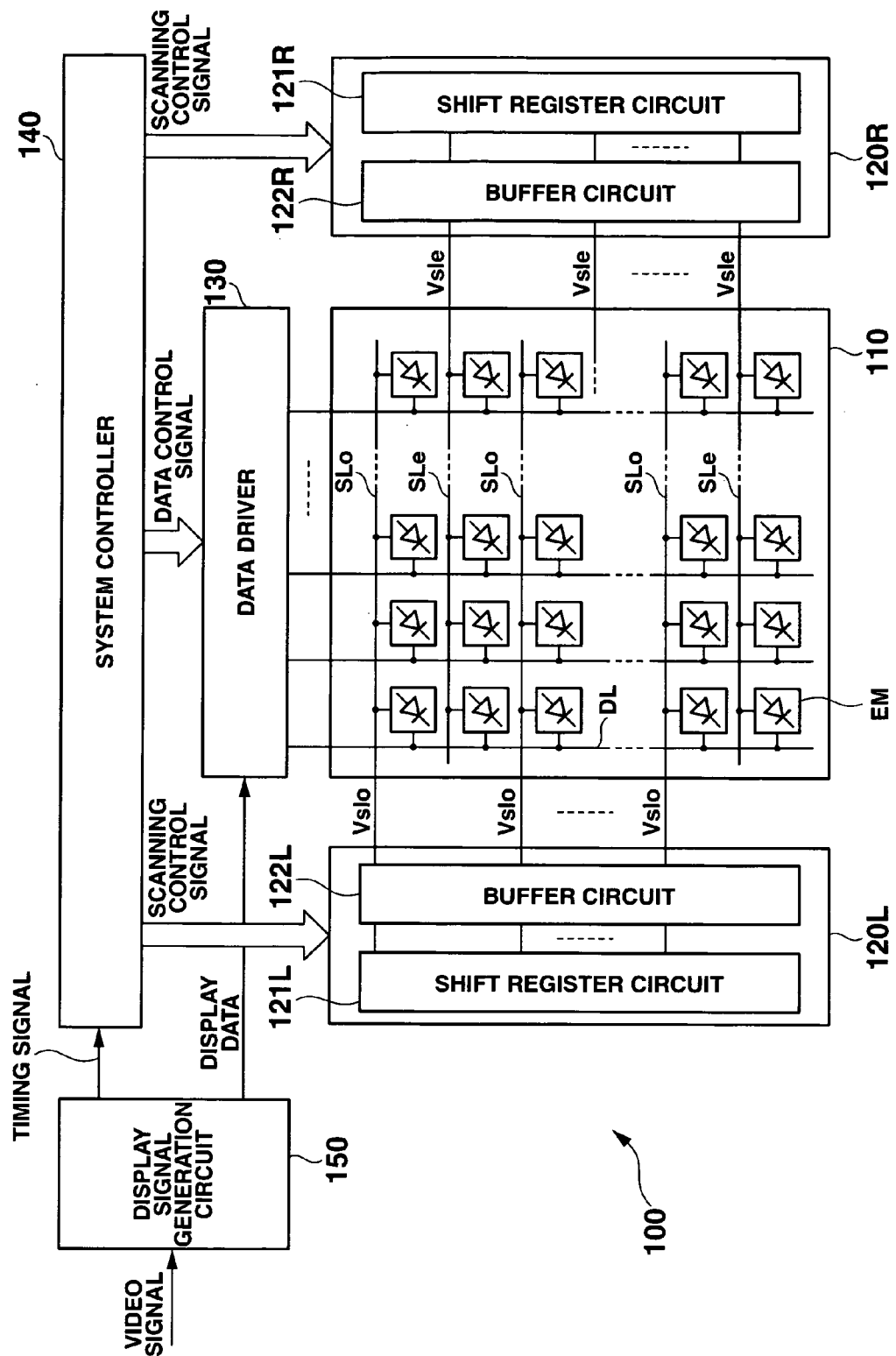
FIG. 5 is a schematic structural view showing an entire structure of an image display apparatus in which the shift register circuit according to the present invention is applied for a scanning driver.

FIG. 5 is a schematic structural view showing an entire structure of an image display apparatus in which the shift register circuit according to the present invention is applied to a scanning driver (a drive control apparatus).

Figure 6A:
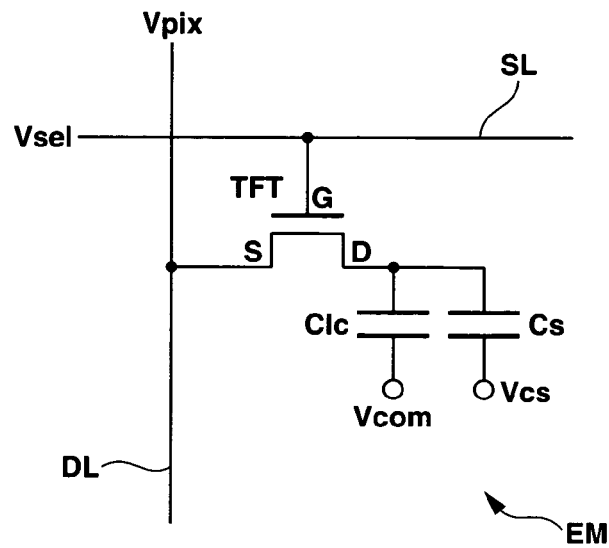
FIGS. 6A and 6B are schematic circuit diagrams respectively showing structural examples of a display pixel constituting a display panel in an image display apparatus according to a first application example.
Figure 6B:
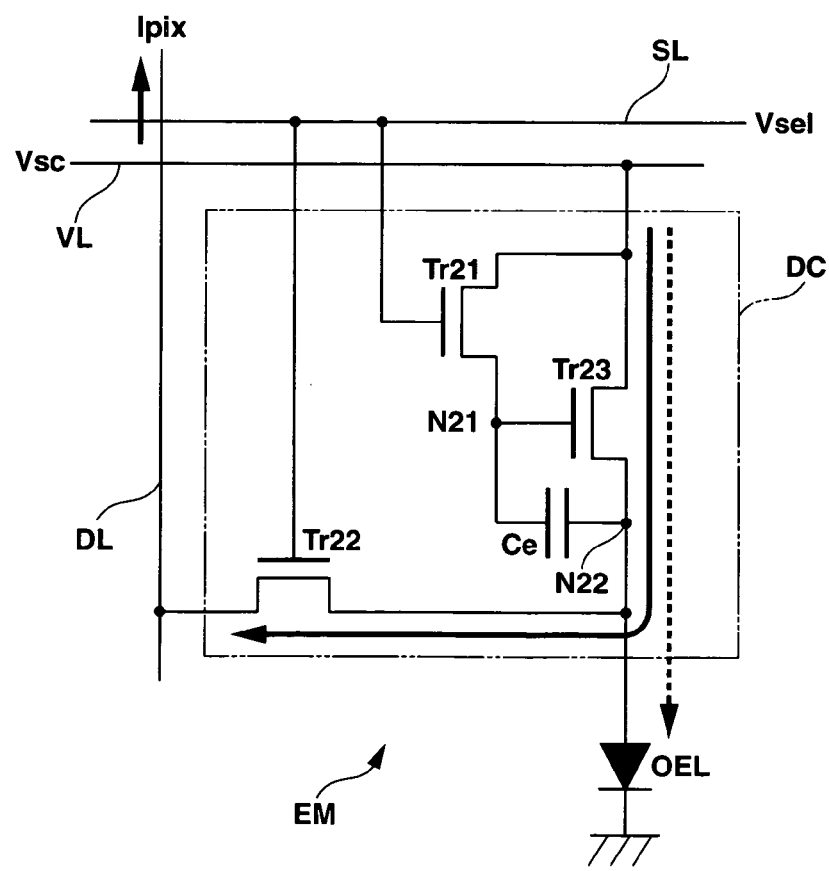

FIGS. 6A and 6B are schematic circuit diagrams showing structural examples of a display pixel constituting a display panel in the image display apparatus according to the first application example.

As shown in FIG. 5, an image display apparatus 100 according to this application example is roughly configured to include: a display panel (a display pixel array) 110 which has a plurality of display pixels EM two-dimensionally arranged therein and corresponds to an active matrix drive mode; an odd-numbered line scanning driver (a first drive control section) 120L which is connected with odd-numbered scanning lines (which will be referred to as "odd-numbered side lines" hereinafter for the convenience's sake) SLo alone of scanning lines which extend to be connected with the display pixels EM arranged in the display panel 110 in a row direction (a lateral direction in the figure), and sequentially sets (scans) the respective display pixels EM in the odd-numbered rows to a selective state; an even-numbered line scanning driver (a second drive control section) 120R which is connected with even-numbered scanning lines (which will be referred to as "even-numbered side lines" hereinafter for the convenience's sake) SLe alone of the scanning liens arranged in the display panel 110, and sequentially sets (scans) the respective display pixels EM in the even-numbered rows to the selective state; a data driver 130 which is connected with respective data lines DL which extend to be connected with the display pixels EM arranged in the display panel 110 in a column direction (a vertical direction in the drawing), and applies a tone signal corresponding to display data to the display pixels EM in the row set to the selective state by the odd-numbered line scanning driver 120L or the even-numbered line scanning driver 120R; a system controller 140 which controls an operating state of each driver by generating and outputting a scanning control signal and a data control signal to the odd-numbered line scanning driver 120L, the even-numbered line scanning driver 120R and the data driver 130 based on various timing signals such as a system clock signal; and a display signal generation circuit 150 which supplies display data to the data driver 130 and the various timing signals to the system controller 140 based on a video signal fed from the outside of the image display apparatus.

In this example, as the display panel 110, it is possible to apply, e.g., a known transmission type or reflection type liquid crystal display panel or a light-emitting type display panel in which display pixels including self-luminous elements such as an organic electroluminescent element (an organic EL element) or a light-emitting diode (an LED) are two-dimensionally arranged.

For example, in case of the liquid crystal display panel, as shown in FIG. 6A, each display pixel (a liquid crystal pixel) EM is configured to include: a pixel transistor (a switch circuit) TFT having a gate terminal (G) connected with a scanning line SL (the odd-numbered side line SLo or the even-numbered side line SLe) and a source terminal (S) connected with a data line DL; a liquid crystal capacitance Clc having a pixel electrode connected with the drain terminal (D) of the pixel transistor TFT and a common electrode connected with a common signal voltage Vcom; and a storage capacitance Cs having a capacitance electrode connected with the drain terminal (D) of the pixel transistor TFT and an opposed electrode connected with a common voltage Vcs (e.g., a common signal voltage Vcom).

In regard to a drive control method in the thus configured display pixel (the liquid crystal pixel) EM, as well known, a scanning signal Vsel is applied to the scanning line SL in each row to turn on the pixel transistor TFT to be set to the selective state, and a tone signal voltage Vpix corresponding to display data is applied to the data line DL in synchronization with this timing. As a result, this voltage is applied to the pixel electrode through the pixel transistor TFT, and a liquid crystal filled in the liquid crystal capacitance Clc is controlled in an alignment state corresponding to the display data, thereby driving display of each display pixel EM.

On the other hand, for example, as shown in FIG. 6B, each display pixel EM in the light-emitting type display panel is configured to include: a thin film transistor (a switch circuit) Tr21 having a gate terminal connected with a scanning line SL (the odd-numbered side line SLo or the even-numbered side line SLe) and a source terminal and a drain terminal respectively connected with a power supply line VL (a power supply voltage Vsc) arranged in parallel with the scanning line SL and a contact point N21; a thin film transistor (a switch circuit) Tr22 having a gate terminal connected with the scanning line SL and a source terminal and a drain terminal respectively connected with a data line DL and a contact point N22; a thin film transistor (a switch circuit) Tr23 having a gate terminal connected with the contact point N21 and a source terminal and a drain terminal respectively connected with the power supply line VL and the contact point N22; a capacitor Ce connected between the contact point N21 and the contact point N22; and a light-emitting element (e.g., an organic EL element) OEL having a cathode terminal connected with a ground potential.

In a drive control method (light emission drive control) of the thus configured display pixel, first, a (high-level) scanning signal is applied to the scanning line SL to turn on the thin film transistors Tr21 and Tr22 to be set to the selective state, a low-level power supply voltage Vsc is applied to the power supply line VL arranged in parallel, and a tone signal (a tone signal current having a negative polarity) corresponding to display data is supplied to the data line DL in synchronization with this timing. As a result, the thin film transistor Tr23 is turned on, and a write current (a specified current; see arrows of a solid line in FIG. 6B) corresponding to the tone signal flows in a direction of the data line DL from the power supply line VL through the thin film transistor Tr23, the contact point N22 and the thin film transistor Tr22. At this time, electric charges corresponding to a potential difference generated between the contact points N21 and N22 (between the gate and the source of the thin film transistor Tr23) are stored in the capacitor Ce, and held (charged) as a voltage component.

Then, interrupting the scanning signal to the scanning line SL (applying the low-level scanning signal) turns off the thin film transistors Tr21 and Tr22 to be set to the non-selective state. Further, the thin film transistor Tr23 maintains the on state based on the voltage component held in the capacitor Ce by applying a high-level power supply voltage Vsc to the power supply line VL. Therefore, a predetermined light emission drive current (an output current; see an arrow of a dotted line in FIG. 6B) flows to the organic EL element from the power supply line VL through the thin film transistor Tr23 and the contact point N22, whereby the organic EL element OEL emits light.

Here, since the voltage component (a charged voltage) held in the capacitor Ce corresponds to a potential difference when a write current corresponding to the tone signal (a tone signal current) flows in the thin film transistor Tr23, the light emission drive current supplied to the organic EL element OEL has a current value which is equivalent to that of the write current, and hence the organic EL element OEL emits light in a luminance tone corresponding to display data (the tone signal current).

A description will now be given as to an example where a display panel (a liquid crystal display panel) in which the liquid crystal pixels shown in FIG. 6A are arranged in a matrix form is applied.

Furthermore, as shown in FIG. 5, the odd-numbered line scanning driver 120L and the even-numbered line scanning driver 120R have: shift register circuits 121L and 121R including shift blocks on a plurality of stages each consisting of a signal holding/erasing section, a level reversing section, an output side push-pull circuit section and a transfer side push-pull circuit section like the foregoing embodiment in accordance with the odd-numbered side lines SLo and the even-numbered side lines SLe in the display panel 110; and buffer circuits 122L and 122R which amplify external output signals output from the shift blocks on the respective stages to predetermined signal levels and sequentially supply the amplified signals as an odd-numbered side scanning signal Vslo and an even-numbered side scanning signal Vsle to the odd-numbered side lines SLo and the even-numbered side lines SLe.

FIG. 7 is a schematic structural view showing an example of the shift register circuit of the odd-numbered line scanning driver in the image display apparatus according to the first application example.

Figure 8:
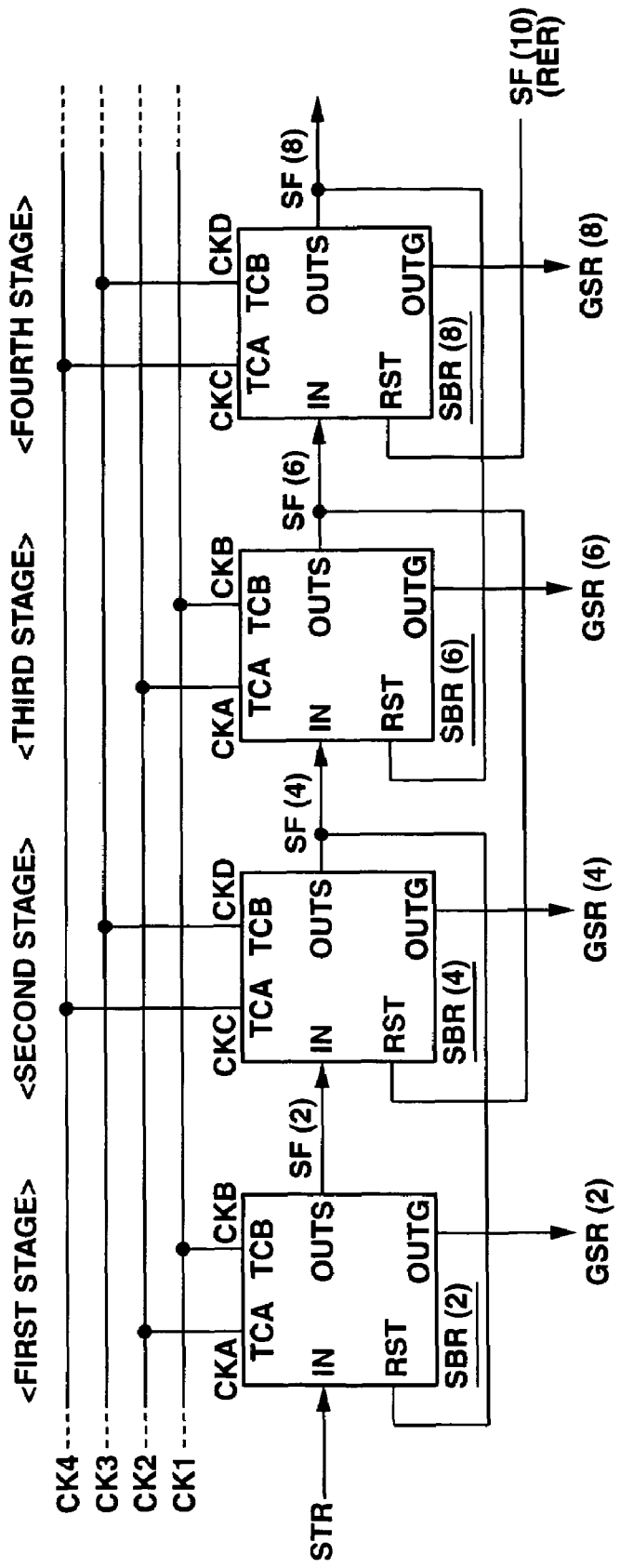
FIG. 8 is a schematic structural view showing an example of a shift register circuit of an even-numbered line scanning driver in the image display apparatus according to the first application example.

FIG. 8 is a schematic structural view showing an example of the shift register circuit of the even-numbered line scanning driver in the image display apparatus according to the first application example.

Here, like or corresponding numerals denote structures equivalent to those in the foregoing embodiment (see FIG. 1), thereby simplifying their explanation. It is to be noted that a description will be given as to a case where the number of scanning lines for one screen of the display panel 110 is 242 for the convenience's sake.

The shift register circuit 121L applied in the odd-numbered line scanning driver 120L, as shown in FIG. 7, specifically includes shift blocks SBL (1), SBL (3), SBL (5), . . . SBL (k), . . . connected in series on a plurality of stages (121 stages) in accordance with the number (121) of the odd-numbered side lines SLo for one screen of the display panel 110. Of clock pulses CK1 to CK4 having four phases supplied from the system controller 140 as scanning control signals, the clock pulses CK1 and CK4 are input as control clock signals CKA and CKB to the odd-numbered shift blocks SLB (1), SBL (5), SBL (9), . . . of the odd-numbered line scanning driver 120L. On the other hand, of the clock pulses CK1 to CK4 having four phases, the clock pulses CK3 and CK2 are input as control clock signals CKC and CKD to the even-numbered shift blocks SBL (3), SBL (7), SBL (11), . . . of the odd-numbered line scanning driver 120L.

Here, as to the clock pulses CK1 to CK4 having four phases supplied from the system controller 140, the clock pulses CK1 and CK3 are set to have a reversal relationship and the clock pulses CK2 and CK4 are set to have a reversal relationship as will be described later. Moreover, in a combination of the clock pulses CK1 and CK4, at least a falling timing of the clock pulse CK4 is set to be ahead of a falling timing of the clock pulse CK1. Additionally, in a combination of the clock pulses CK3 and CK2, at least a falling timing of the clock pulse CK2 is set to be ahead of a falling timing of the clock pulse CK3.

Further, like the configuration of the shift register circuit described in conjunction with the foregoing embodiment, a scanning start signal STL (corresponding to the aforementioned start signal ST) and a reset signal REL (corresponding to the aforementioned reset signal RED) which are supplied as scanning control signals from the system controller 140 are input to the shift block SBL (1) on a first stage and the shift block SBL (241) on a last stage.

Each of shift blocks SBL (1), SBL (3), SBL (5), . . . SBL (k), . . . on the respective stages sequentially transfers a shift signal SFL (k) output from the transfer side push-pull circuit section to the shift block on the next stage, and sequentially applies an external output signal GSL (k) output from the output side push-pull circuit section to each of the odd-numbered side lines SLo through a non-illustrated buffer circuit as an odd-number side scanning signal Vslo.

Furthermore, as shown in FIG. 8, the shift register circuit 121R applied in the even-numbered line scanning driver 120R specifically includes shift blocks SBR (2), SBR (4), SBR (6), . . . SBR (k+1), . . . connected in series to a plurality of stages (121 stages) in accordance with the number (121) of the even-numbered side lines SLe for one screen of the display panel 110. Of clock pulses CK1 to CK4 having four phases supplied as scanning control signals from the system controller 140, the clock pulses CK1 and CK2 are input as control clock signals CKA and CKB to the odd-numbered shift blocks SBR (2), SBL (6), SBL (10), . . . of the even-numbered line scanning driver 120R. On the other hand, of the clock pulses CK1 to CK4 having four phases, the clock pulses CK3 and CK4 are input as control clock signals CKC and CKD to the even-numbered shift blocks SBR (4), SBL (8), SBL (12), . . . of the even-numbered line scanning driver 120R.

Here, as to the clock pulses CK1 to CK4 having four phases supplied from the system controller 140, as will be described later, in a combination of the clock pulses CK1 and CK2, at least a falling timing of the clock pulse CK1 is set to be ahead of a falling timing of the clock pulse CK2. Moreover, in a combination of the clock pulses CK3 and CK4, at least a falling timing of the clock pulse CK3 is set to be ahead of a falling timing of the clock pulse CK4.

Additionally, like the even-numbered side shift register circuit 121L, a scanning start signal STR (corresponding to the aforementioned start signal ST) and a reset signal RER (corresponding to the aforementioned reset signal RED) supplied as scanning control signals from the system controller 140 are input to the shift block SBR (2) on a first stage and the shift block SBR (242) on a last stage.

Each of the shift blocks SBL (2), SBL (4), SBL (6), . . . SBR (k+1), . . . on the respective stages sequentially transfers a shift signal SFR (k+1) output from the transfer side push-pull circuit section to the shift block on the next stage, and sequentially applies an external output signal GSR (k+1) output from the output side push-pull circuit section to each even-numbered side line SLE as an even-numbered side scanning signal Vsle through a non-illustrated buffer circuit.

The data driver 130 fetches and holds display data for one row in the display panel 110 supplied from the display signal generation circuit 150 based on a data control signal fed from the system controller 140, generates a tone signal (a tone signal voltage Vpix in this application example) corresponding to this display data, and supplies the generated tone signal to each display pixel EM set to the selective state by the odd-numbered line scanning driver 120L and the even-numbered line scanning driver 120R through each data line DL, thereby effecting control to write the tone signal.

The display signal generation circuit 150 extracts, e.g., a luminance tone signal component and a timing signal component from a video signal supplied from the outside of the image display apparatus 100, supplies the luminance tone signal component as display data to the data driver 130 and also supplies the timing signal component to the system controller 140 in accordance with each row in the display panel 110.

The system controller 140 generates and outputs the above-described scanning control signal to at least the odd-numbered line scanning driver 120L and the even-numbered line scanning driver 120R based on the timing signal fed from the display signal generation circuit 150, and generates and outputs a data control signal to the data driver 130. As a result, each driver is operated at a predetermined timing, and the display panel 110 is allowed to output the odd-numbered side scanning signal Vslo, the even-numbered side scanning signal Vsle and a tone signal (a tone signal voltage Vpix) so that the display drive operation in each display pixel EM is continuously executed, thereby effecting control to display predetermined image information based on the video signal in the display panel 110.

In the image display apparatus having such a configuration, when a switching element constituting each display pixel (a display pixel including the above-described liquid crystal pixel or self-luminous element) arranged in the display panel and a switching element constituting the scanning driver (the above-described shift register circuit section in particular) or the data driver as a peripheral circuit are formed by applying thin film transistors or the like which are of the same channel type, the display panel section and the peripheral circuit section can be integrally configured on a single panel substrate. As a result, a scale and a thickness of the apparatus can be reduced, and a manufacturing process is realized as a common process and simplified, thereby realizing an inexpensive image display apparatus. In particular, applying as the switching element a thin film transistor or the like formed of a semiconductor material such as amorphous silicon or zinc oxide can manufacture a thin film transistor (the switching element) having uniform element characteristics in a simple manufacturing process.

Additionally, in the image display apparatus according to this application example, as shown in FIGS. 7 and 8, the clock pulses CK1 to CK4 having four phases must be supplied in order to control driving of the odd-numbered line scanning driver 120L and the even-numbered line scanning driver 120R (which will be described later in detail). However, since the clock pulses CK1 to CK4 having four phases can be shared by the odd-numbered line scanning driver 120L and the even-numbered line scanning driver 120R, it is good enough for the clock pulses supplied as scanning control signals from the system controller 140 to the odd-numbered line scanning driver 120L and the even-numbered line scanning driver 120R to have a total of four phases (four types).

In the image display apparatus according to this embodiment, the odd-numbered line side scanning driver 120L and the even-numbered line side scanning driver 120R are arranged to face each other (arranged in a lateral direction in FIG. 5) with the display panel 110 positioned therebetween. However, the present invention is not restricted to this configuration, and these drivers may be aligned and arranged on one side (e.g., one of right and left sides) of the display panel 110, for example.

A drive control method (an image display operation) of the thus configured image display apparatus will now be described with reference to the accompanying drawings.

Figure 9:
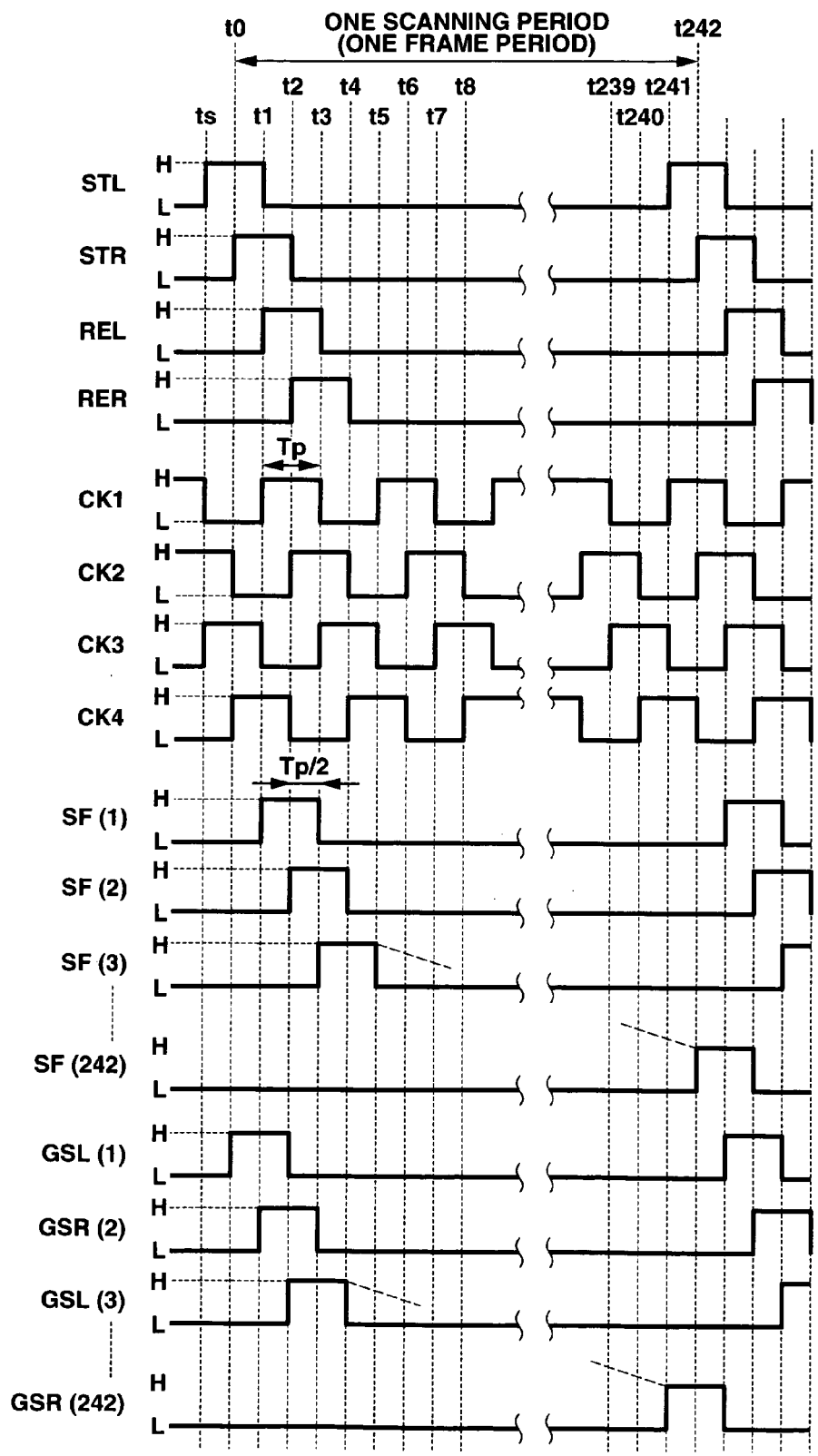
FIG. 9 is a timing chart showing an example of a drive control method (an image display operation) in the image display apparatus according to the first application example.

FIG. 9 is a timing chart showing an example of a drive control method (an image display operation) in the image display apparatus according to the first application example.

A description will be given while appropriately making reference to the circuit configuration and the drive control method of the shift register circuit explained in conjunction with the foregoing embodiment.

First, four types of clock pulses CK1 to CK4 which are supplied as control clock signals CKA and CKB and control clock signals CKC and CKD to the respective shift register circuits (the shift blocks SBL (k), SBR (k+1)) of the odd-numbered line scanning driver 120L and the even-numbered line scanning driver 120R shown in FIGS. 7 and 8 are set to have the same signal width Tp which provides the high level as shown in, e.g., FIG. 9. Further, signal periods in which the high level is realized are set to overlap for each period which is ½ of the signal width Tp (Tp/2) in terms of time.

That is, the clock pulse CK2 is set to rise to the high level to be behind the clock pulse CK1 for a time Tp/2. Likewise, the clock pulse CK3 is set to rise to the high level to be behind the clock pulse CK2 for the time Tp/2, the clock pulse CK4 is set to rise to the high level to be behind the clock pulse CK3 for the time Tp/2 and the clock pulse CK1 is set to rise to the high level to be behind the clock pulse CK4 for the time Tp/2.

In other words, the clock pulse CK1 is set to fall to the low level while being time Tp/2 ahead of the clock pulse CK2. Likewise, the clock pulse CK2 is set to fall to the low level to be ahead the time Tp/2 from the clock pulse 3, the clock pulse CK3 is set to fall to the low level to be ahead the time Tp/2 from the clock pulse CK4, and the clock pulse CK4 is set to fall to the low level to be ahead the time Tp/2 from the clock pulse CK4.

Furthermore, each of the shift signals SF (k) and SF (k+1) and the external output signals GSL (k) and GSR (k+1) from the shift blocks SBL (k) and SBR (k+1) on the respective stages constituting the respective shift register circuits of the odd-numbered line scanning driver 120L and the even-numbered line scanning driver 120R is set to the low level in an initial state.

In the odd-numbered line scanning driver 120L and the even-numbered line scanning driver 120 set to such an initial state, like the drive control method (the signal fetching/holding operation) of the shift register circuit described in conjunction with the foregoing embodiment, a shift start signal STL supplied as a scanning control signal from the system controller 140 is input to the shift block SBL (1) on the first stage in the shift register circuit of the odd-numbered line scanning driver 120L (<ts> to <t1>) prior to a timing <t1> at which the clock pulse CK1 rises to the high level, and a shift start signal STR likewise supplied as a scanning control signal is input to the shift block SBR (2) on the first stage in the shift register circuit of the even-numbered line scanning drier 120R (<t0> to <t2>) prior to a timing <t2> at which the clock pulse CK2 rises to the high level.

As a result, in the odd-numbered line scanning driver 120L, a shift signal SF (1) is output to the shift block SBL (3) on the next stage in a period (a timing <t1> to <t3>) where the clock pulse CK1 supplied as the control clock signal CKA to the shift block SBL (1) on the first stage changes to the high level. Further, in a period (a timing <t0> to <t2>) where the clock pulse CK4 supplied as the control clock signal CKB changes to the high level, an external output signal GSL (1) which serves as a scanning signal Vslo applied to the first scanning line SLo is output. Like the drive control method (the signal reset operation) of the shift register circuit described in conjunction with the foregoing embodiment, this signal output operation continues (a timing <t3>) until the shift signal SF (1) is fetched into the shift block SBL (3) on the next stage and the high-level clock pulse CK3 is supplied as the control clock signal CKC to the shift block SBL (3).

Furthermore, in the even-numbered line scanning driver 120R, likewise, a shift signal SF (2) is output to the shift block SBR (4) on the next stage in a period (a timing <t2> to <t4>) where the clock pulse CK2 supplied as the control clock signal CKA to the shift block SBR (2) on the first stage changes to the high level. Moreover, in a period (a timing <t1> to <t3>) where the clock pulse CK1 supplied as the control clock signal CKB changes to the high level, an external output signal GSR (2) which serves as a scanning signal Vsle applied to the second scanning line SLe is output. This signal output operation continues (a timing <t4>) until the shift signal SF (2) is fetched into the shift block SBR (4) on the next stage and the high-level clock pulse CK4 is supplied as the control clock signal CKC to the shift block SBR (4).

Then, in the odd-numbered line scanning driver 120L, a shift signal SF (3) is output to the shift block SBL (5) on the next stage based on the shift signal SF (1) output from the shift block SBL (1) on the previous stage in a period (a timing <t3> to <t5>) where the clock pulse CK3 supplied as the control clock signal CKC to the shift block SBL (3) on the second stage changes to the high level. Additionally, in a period (a timing <t2> to <t4>) where the clock pulse CK2 supplied as the control clock signal CKD changes to the high level, an external output signal GSL (3) which serves as a scanning signal Vslo applied to the third scanning line SLo is output.

This signal output operation continues (a timing <t5>) until the shift signal SF (3) is fetched into the shift block SBL (5) on the next stage and the high-level clock pulse CK1 is supplied as the control clock signal CKA to the shift block SBL (5).

Subsequently, in the even-numbered line scanning driver 120R, a shift signal SF (4) is output to the shift block SBR (6) on the next stage based on the shift signal SF (2) output from the shift block SBR (2) on the previous stage in a period (a timing <t4> to <t6>) where the clock pulse CK4 supplied as the control clock signal CKC to the shift block SBR (4) on the second stage changes to the high level. Further, in a period (a timing <t3> to <t5>) where the clock pulse CK3 supplied as the control clock signal CKD changes to the high level, an external output signal GSR (4) which serves as a scanning signal Vsle applied to the fourth scanning line SLe is output. This signal output operation continues (a timing <t6>) until the shift signal SF (4) is fetched into the shift block SBR (6) on the next stage and the high-level clock pulse CK2 is supplied as the control clock signal CKA to the shift block SBR (6).

Thereafter, as shown in FIG. 9, in the odd-numbered line scanning driver 120L and the even-numbered line scanning driver 120R, the same operations are alternately repeatedly executed, and the shift signals SF (k) and SF (k+1) are transferred between the shift blocks SBL (k) and SBR (k+1) on the respective stages in each shift register circuit, whilst the external output signals GSL (k) and GSR (k+1) are output. As a result, the scanning signals Vsel (Vslo and Vsle) corresponding to the respective scanning lines SL (SLo and SLe) of the respective rows arranged in the display panel 110 are sequentially output. Therefore, each display pixel EM arranged in the display panel 110 can be set to the selective stage in accordance with each row in a predetermined cycle.

Furthermore, in synchronization with a timing at which each display pixel EM in each row is set to the selective state, a tone signal (a tone signal voltage Vpix or a tone signal current Ipix) corresponding to display data is supplied from the data driver 130 through the data line DL in each column. As a result, the display data is written in each display pixel EM, whereby an alignment state of the liquid crystal is changed. Therefore, when the same display data is written in each row set to the selective state, predetermined image information based on a video signal is displayed in the display panel 110.

In order to sequentially set (scan) all the scanning lines SL arranged in the display panel 110 to the selective state in this manner, it is good enough to sequentially and alternately output the scanning signals from the odd-numbered line scanning driver 120L and the even-numbered line scanning driver 120R. Therefore, it is good enough for each operating frequency of the odd-numbered line scanning driver 120L and the even-numbered line scanning driver 120R in one scanning period (one frame period) to be a substantially ½ operating frequency as compared with a know configuration in which a single scanning driver alone is applied.

Therefore, the display panel having a relatively large number of scanning lines and a high operating frequency can be driven to excellently display an image by using the scanning drivers having a low operating frequency. Furthermore, a thin film transistor having relatively low electron mobility can be applied in the shift register circuit constituting the odd-numbered line scanning driver and the even-numbered line scanning driver. Therefore, for example, an amorphous silicon transistor or the like whose manufacturing process is simple can be applied, thereby realizing an inexpensive image display apparatus.

In this application example in particular, when the scanning drivers (the odd-numbered line scanning driver and the even-numbered line scanning driver) each including the shift register circuit according to the foregoing embodiment is applied, the control clock signal CKB or CKD for scanning is set to fall prior to a reset operation start timing (corresponding to a timing at which the control clock signal CKA or CKC for transfer falls and a transfer operation of each shift signal between the shift blocks is terminated) so that an operation of outputting the external output signal which serves as a scanning signal is terminated (the low-level external output signal is output).

As a result, even if the shift register circuit is configured by applying an amorphous silicon transistor or the like having low electron mobility and element characteristics which considerably deteriorate with time, signal characteristics (a falling operation in particular) of the external output signal can be controlled by a switching element having small deterioration in characteristics (i.e., which corresponds to the thin film transistor Tr17 constituting the output side push-pull circuit section 30 mentioned above) of switching elements constituting the output section of each shift block. Therefore, even when the scanning drivers are driven for a long period of time, a signal level of the external output signal can be rapidly changed (changed to the low level), thereby realizing the image display apparatus having stable image display characteristics.

Further, in an image display apparatus including a display panel having such liquid crystal display pixels as described in conjunction with this application example, it is generally known that a fluctuation (a shift) ΔV of a pixel write voltage is generated when a pixel transistor TFT provided to each display pixel EM is turned off. In particular, it is known that a value of the voltage fluctuation ΔV is changed (reduced) due to dullness of falling characteristics of a scanning signal (the external output signal) or a delay.

Therefore, when the image display apparatus is shipped or a power supply is turned on, even though a central voltage of a common signal voltage Vcom applied to a common electrode of a liquid crystal capacitance is corrected to have an optimum value in accordance with a value of the voltage fluctuation ΔV, a value of the voltage fluctuation ΔV is changed by deterioration in falling characteristics of the scanning signal caused due to driving the image display apparatus (the scanning driver) for a long time. Therefore, the central voltage of the common signal voltage Vcom deviates from the optimum value, resulting in a problem that flickers are generated in a display image or burn-in of the liquid crystal occurs.

According to the image display apparatus of this application example, as described above, even after the scanning driver is driven for a long time, deterioration in signal characteristics (falling characteristics) of the scanning signal (the external output signal) can be suppressed, thereby restraining a change in the voltage fluctuation ΔV. As a result, it is possible to realize the image display apparatus superior in image information display characteristics or durability of the display panel.

It is to be noted that the clock pulses CK1 to CK4 selected as the control clock signals CKA and CKB or CKC or CKD are set to overlap for each period which is ½ of a signal width Tp in terms of time in this application example, and hence high-level periods (i.e., selection periods of the display pixels EM) of the scanning signals Vslo and Vsle which are alternately output from the odd-numbered line scanning driver 120L and the even-numbered line scanning driver 120R partially overlap between scanning lines adjacent to each other (the odd-numbered side lines SLo or the even-numbered side lines SLe). However, in this case, since the tone signal (the tone signal voltage Vpix) written in each display pixel EM is determined by a signal level immediately before a timing at which each scanning signal Vslo or Vsle falls to the low level (i.e., a timing at which the non-selective state is set). Therefore, a problem of a display operation (a display data write operation) does not occur due to overlapping of the selection periods (the periods in which the scanning signal Vslo or Vsle is at the high level) overlap between the scanning lines adjacent to each other.

Furthermore, in the image display apparatus according to this application example, although the control clock signals CKA and CKC for transfer to the shift register circuit of each scanning driver and the control clock signals CKB and CKD for scanning are selected from the clock pulses CK1 to CK4 having four phases, the control clock signal for transfer and the control clock signal for scanning are set to have a relationship that their phases are shifted by an amount which is ½ of the signal width Tp of the clock pulse. Therefore, the clock pulses having four phases may be generated and supplied to each scanning driver by, e.g., appropriately shifting a rising (or falling) timing (phase) of a single clock pulse.

Second Application Example

A second application example of a shift register circuit according to this embodiment will now be described with reference to the accompanying drawings.

Figure 10:
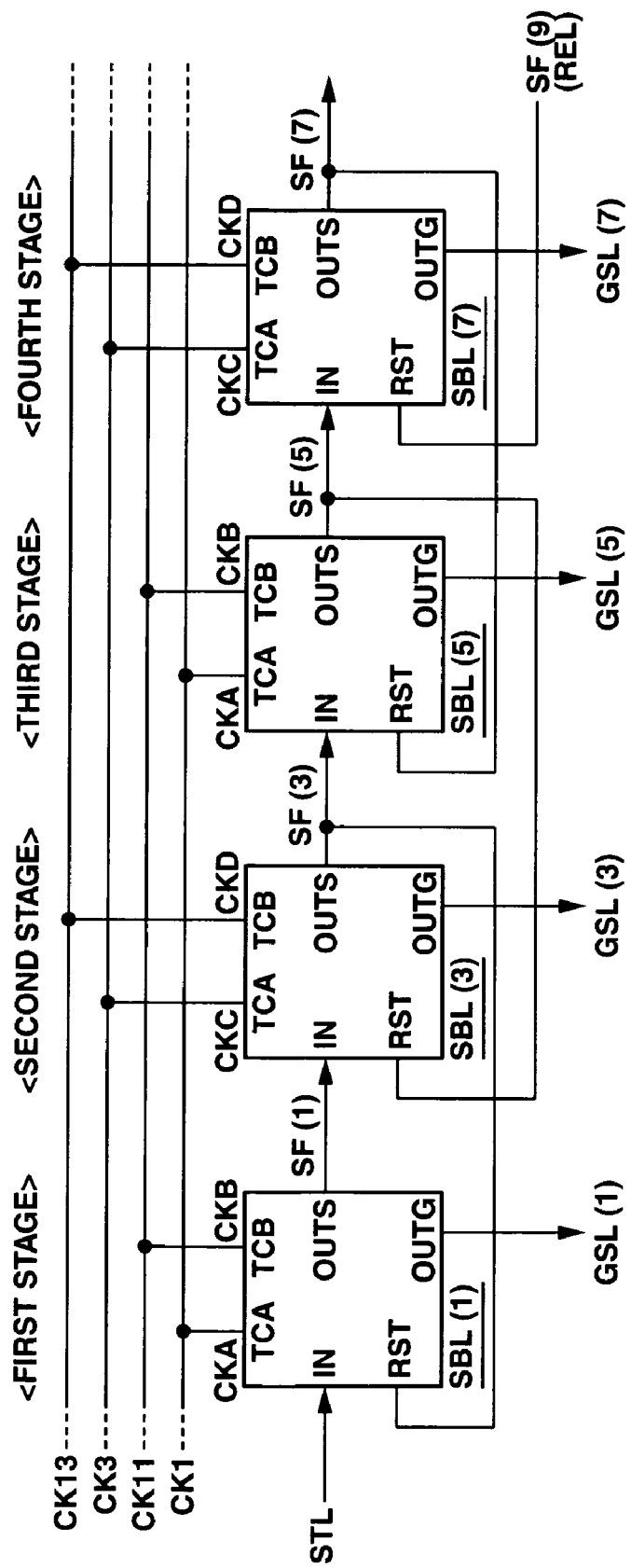
FIG. 10 is a schematic structural view showing an example of a shift register circuit of an odd-numbered line scanning driver in an image display apparatus according to a second application example.

FIG. 10 is a schematic structural view showing an example of a shift register circuit of an odd-numbered line scanning driver in an image display apparatus according to the second application example.

Figure 11:
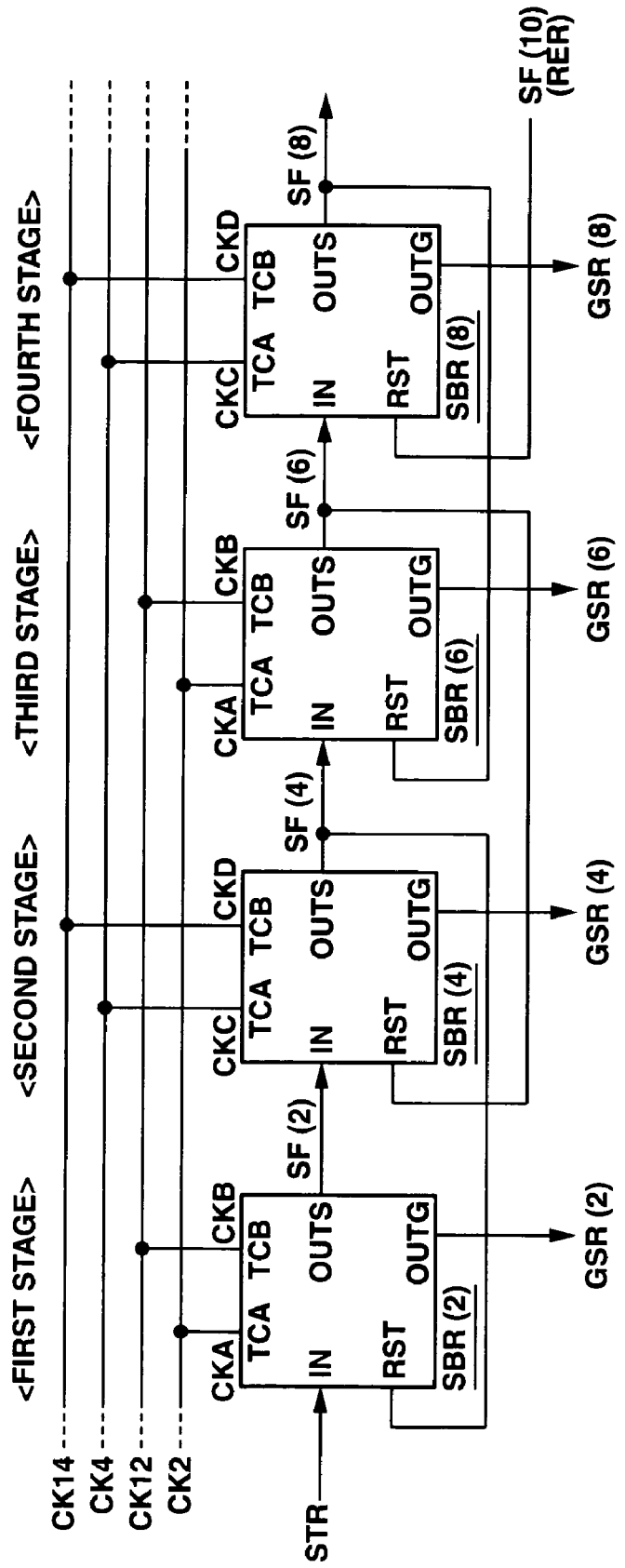
FIG. 11 is a schematic structural view showing an example of a shift register circuit an even-numbered line scanning driver in the image display apparatus according to the second application example.

FIG. 11 is a schematic structural view showing an example of a shift register circuit of an even-numbered line scanning driver in the image display apparatus according to the second application example.

Here, like or corresponding reference numerals denote structures equivalent to those in the first application example, thereby eliminating their explanation. It is to be noted that the entire configuration of the image display apparatus according to this application example is equivalent to the first application example (see FIG. 5), thus eliminating its explanation.

First, in this application example, each of control clock signals CKA and CKC supplied as scanning control signals from a system controller 140 to respective shift register circuits (shift blocks SBL (k) and SBR (k+1)) of an odd-numbered line scanning driver 120L and an even-numbered line scanning driver 120R is set to one of the four types of clock pulses CK1 to CK4 described in conjunction with the first application example. On the other hand, each of control clock signals CKB and CKD is set to one of four types of clock pulses CK11 to CK14 having a signal width (Tp/2) which is ½ of a signal width (a high-level time width) Tp of each of the clock pulses CK1 to CK4.

As shown in FIG. 10, like the first application example, the shift register circuit 121L applied in the odd-numbered line scanning driver 120L specifically includes shift blocks SBL (1), SBL (3), SBL (5), ... SBL (k), ... connected on a plurality of stages (121 stages) corresponding to the number (e.g., 121) of odd-numbered side lines SLo arranged in a display panel 110. The clock pulse CK1 is input as the control clock signal CKA and the clock pulse CK11 is input as the control clock signal CKB to the odd-numbered shift blocks SBL (1), SBL (5), SBL (9) .... On the other hand, the clock pulse CK3 is input as the control clock signal CKC and the clock pulse CK13 is input as the control clock signal CKD to the even-numbered shift blocks SBL (3), SBL (7), SBL (11), ....

Further, as shown in FIG. 11, the shift register circuit 121R applied in the even-numbered line scanning driver 120R includes shift blocks SBR (2), SBR (4), SBR (6), ... SBR (k+1), ... connected on a plurality of stages (121 stages) corresponding to the number (e.g., 121) of even-numbered side lines SLe arranged in the display panel 110. The clock pulse CK2 is input as the control clock signal CKA and the clock pulse CK12 is input as the control clock signal CKB to the odd-numbered shift blocks SBR (2), SBR (6), SBR (10), .... On the other hand, the clock pulse CK4 is input as the control clock signal CKC and the clock pulse CK14 is input as the control clock signal CKD to the even-numbered shift blocks SBR (4), SBR (8), SBR (12), ....

Here, a relationship of the clock pulses CK1 to CK4 and CK11 to CK14 supplied to the odd-numbered line scanning driver 120L and the even-numbered line scanning driver 120R from the system controller 140 is set in such a manner that the clock pulse CK11 rises to the high level in synchronization with the clock pulse CK1 and falls to the low level ahead a time Tp/2 from the clock pulse CK1 as will be described later. Likewise, the clock pulse CK12 rises to the high level in synchronization with the clock pulse CK2 and falls to the low level ahead the time Tp/2 from the clock pulse CK2. Furthermore, the clock pulse CK13 rises to the high level in synchronization with the clock pulse CK3 and falls to the low level ahead the time Tp/2 from the clock pulse CK3. Moreover, the clock pulse CK14 rises to the high level in synchronization with the clock pulse CK4 and falls to the low level ahead the time Tp/2 from the clock pulse CK4.

A drive control method (an image display operation) of the image display apparatus according to this application example will now be described with reference to the accompanying drawings.

Figure 12:
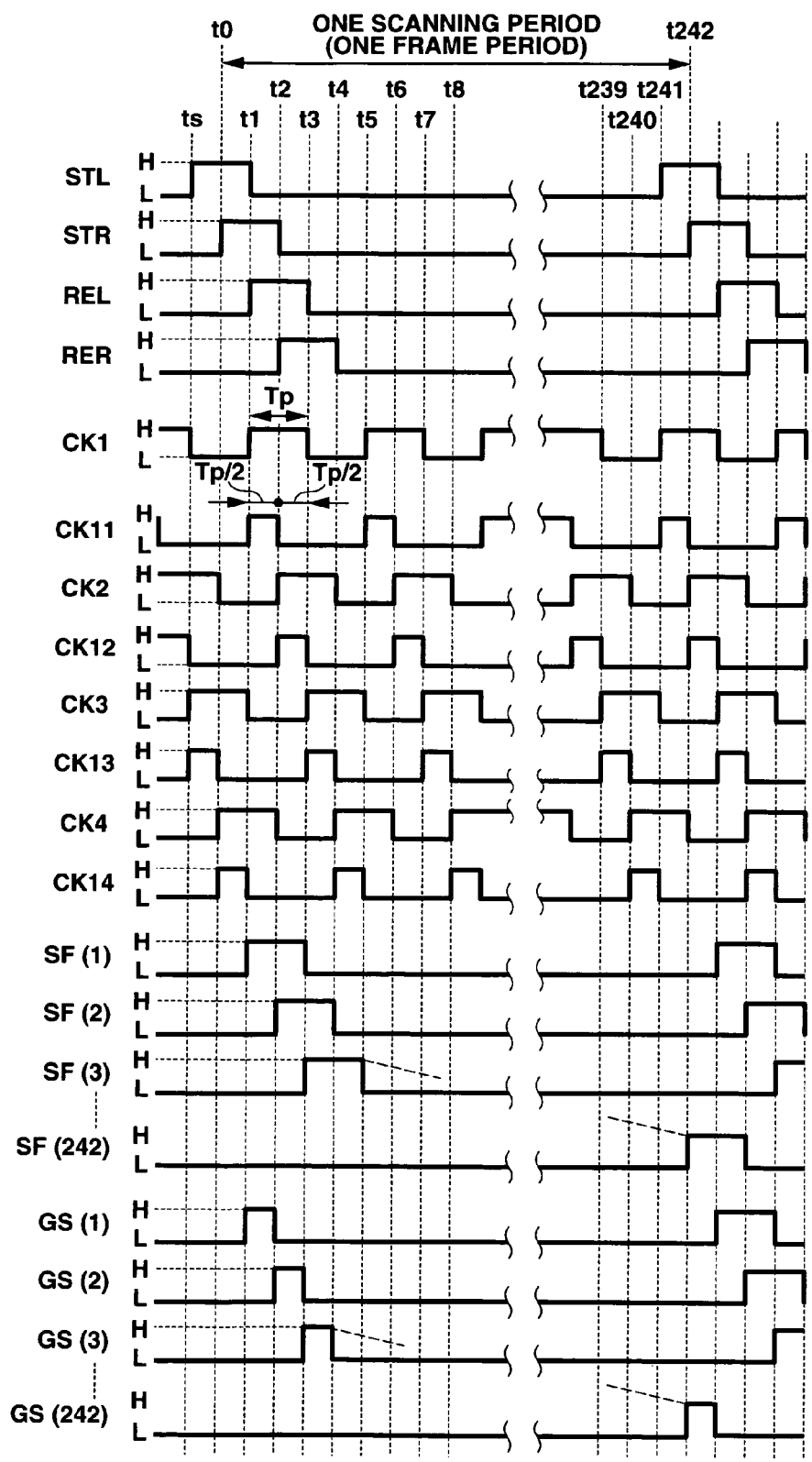
FIG. 12 is a timing chart showing an example of a drive control method (an image display operation) in the image display apparatus according to the second application example.
Figure 13:
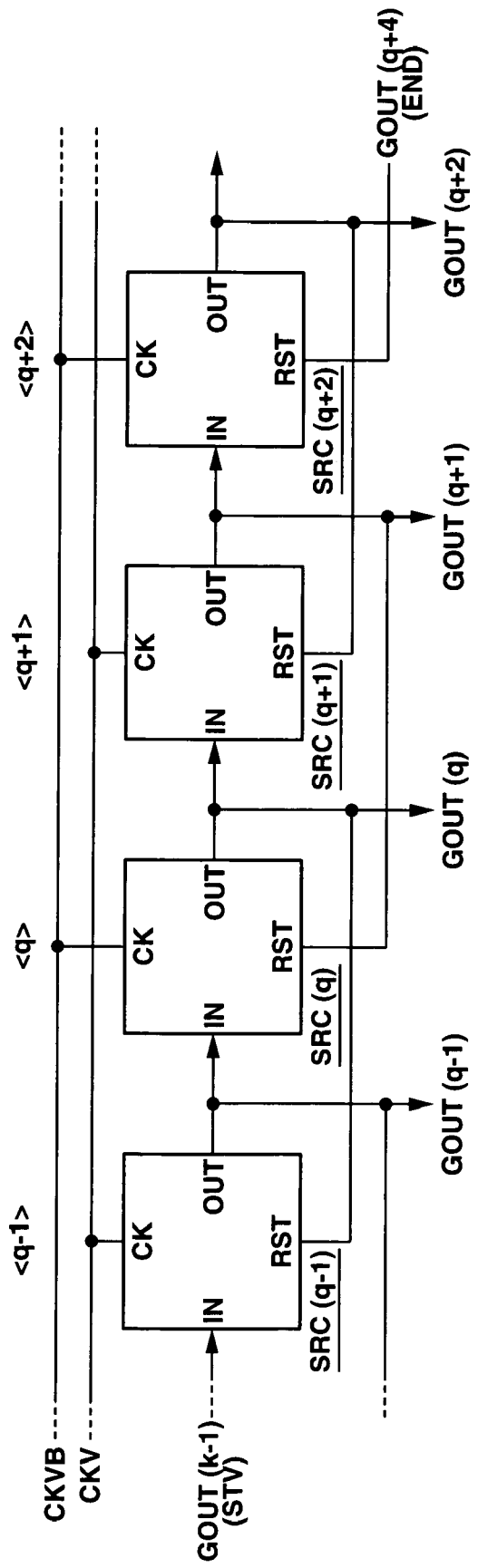
FIG. 13 is a structural view of a primary part showing an example of a scanning driver (a shift register circuit section) applied in a liquid crystal display apparatus according to a prior art.

FIG. 12 is a timing chart showing an example of a drive control method (an image display operation) in the image display apparatus according to the second application example.

Here, a description on a control operation equivalent to that in the first application example will be simplified.

Specifically, according to the drive control method of the image display apparatus of this application example, first, a shift start signal STL is input to the shift block SBL (1) on a first stage prior to a timing <t1> (a timing <ts> to <t1>) at which the clock pulse CK1 rises to the high level in the odd-numbered line scanning drier 120L set to an initial state (a state where a shift signal SF (k) and an external output signal GSL (k) in the shift block SBL (k) of each shift register circuit are set to the low level), and a shift start signal STR is input to the shift block SBR (2) on a first stage prior to a timing <2> (a timing <t0> to <t2>) at which the clock pulse CK2 rises to the high level in the even-numbered line scanning driver 120R set to an initial state (a state where a shift signal SF (k+1) and an external output signal GSL (k+1) in the shift block SBR (k+1) of each shift register circuit are set to the low level).

As a result, in the odd-numbered line scanning driver 120L, a shift signal SF (1) is output to the shift block SBL (3) on the next stage in a period (a timing <t1> to <t3>) where the high-level clock pulse CK1 (the control clock signal CKA) is supplied to the shift block SBL (1) on the first stage, and an external output signal GSL (1) which serves as a scanning signal Vslo applied to the first scanning line SLo is output in a period (a timing <t1> to <t2>) where the high-level clock pulse CK11 (the control clock signal CKB) is supplied. Here, a signal output operation of the shift signal SF(1) continues (a timing <t3>) until a shift signal SF (3) as a reset signal is output from the shift block SBL (3) on the next stage (that is, until the high-level clock pulse CK3 is supplied to the shift block SBL (3)).

Then, in the even-numbered line scanning driver 120R, likewise, a shift signal SF (2) is output to the shift block SBR (4) on the next stage in a period (a timing <t2> to <t4>) where the high-level clock pulse CK2 (the control clock signal CKA) is supplied to the shift block SBR (2) on the first stage, and an external output signal GSR (2) which serves as a scanning signal Vsle applied to the second scanning line SLe is output in a period (a timing <t2> to <t3>) where the high-level clock pulse CK12 (the control clock signal CKB) is supplied. Here, a signal output operation of the shift signal SF (2) continues (a timing <t4>) until a shift signal SF (4) as a reset signal is output from the shift block SBR (4) on the next stage (that is, until the high-level clock pulse CK4 is supplied to the shift block SBR (4)).

Then, in the odd-numbered line scanning driver 120L, the shift signal SF (3) is output to the shift block SBL (5) on the next stage based on the shift signal SF (1) in a period (a timing <t3> to <t5>) where the clock pulse CK3 (the control clock signal CKC) is supplied to the second shift block SBL (3), and an external output signal GSL (3) which serves as a scanning signal Vslo applied to the third scanning line SLo is output in a period (a timing <t3> to <t4>) where the clock pulse CK13 (the control clock signal CKD) is supplied. Here, a signal output operation of the shift signal SF (3) continues (a timing <t5>) until a shift signal SF (5) is output from the shift block SBL (5) on the next stage (until the clock pulse CK1 is supplied to the shift block SBL (5)).

Then, in the even-numbered line scanning driver 120R, the shift signal SF (4) is output to the shift block SBR (6) on the next stage based on the shift signal SF (2) in a period (a timing <t4> to <t6>) where the clock pulse CK4 (the control clock signal CKC) is supplied to the second shift block SBR (4), and an external output signal GSR (4) which serves as a scanning signal Vsle applied to the fourth scanning line SLe is output in a period (a timing <t4> to <t5>) where the clock pulse CK14 (the control clock signal CKD) is supplied. Here, a signal output operation of the shift signal SF (4) continues (a timing <6>) until a shift signal SF (6) is output from the shift block SBR (6) on the next stage (until the clock pulse CK2 is supplied to the shift block SBR (6)).

Thereafter, as shown in FIG. 12, in the odd-numbered line scanning driver 120L and the even-numbered line scanning driver 120R, the same operations are alternately repeatedly executed, and the shift signals SF (k) and SF (k+1) are transferred between SBL (k) and SBR (k+1) on the respective stages of the respective shift register circuits, while the external output signals GSL (k) and GSR (k+1) are output. As a result, the scanning signals Vsel (Vslo and Vsle) corresponding to the scanning lines SL (Slo and SLe) in the respective rows arranged in the display panel 110 are sequentially output, whereby each display pixel EM arranged in the display panel 110 can be set to the selective state in a predetermined cycle.

Therefore, in this application example, in order to sequentially set (scan) all the scanning lines SL (Slo and SLe) arranged in the display panel 110 to the selective state, the scanning signals Vsel (Vslo and Vsle) are sequentially alternately output from the odd-numbered line scanning driver 120L and the even-numbered line scanning driver 120R. Therefore, it is good enough for each of operating frequencies of the odd-numbered line scanning driver 120L and the even-numbered line scanning driver 120R in one scanning period (one frame period) to be a ½ operating frequency as compared with a known configuration in which a single scanning driver alone is applied.

As a result, the display panel having relatively many scanning lines and a high operating frequency can be excellently driven for display by using the scanning drivers each having a low operating frequency, and a thin film transistor having relatively low electron mobility can be applied in the shift register circuit constituting the odd-numbered line scanning driver and the even-numbered line scanning driver. Therefore, for example, an amorphous silicon transistor or the like whose manufacturing process is simple can be applied, thereby realizing an inexpensive image display apparatus.

In the drive control method according to this application example in particular, each of the scanning control clock signals CKB and CKD is set to have a shorter signal width than that of each of the transfer control clock signals CKA and CKC, and set to rise in synchronization with each of the transfer control clocks signal CKA and CKC and fall ahead of falling of each of the transfer control clock signals CKA and CKC (or falling of the reset signal).

As a result, even if an amorphous silicon transistor or the like whose element characteristics considerably deteriorate over time is applied for an output section of each shift block, an on operation period of a switching element (that is, which corresponds to the thin film transistor Tr17 constituting the output side push-pull circuit section 30) which controls a signal level of the scanning signal (the external output signal) can be further reduced, and deterioration of falling characteristics of the scanning signal (the external output signal) involved by deterioration of the element characteristics can be suppressed. Moreover, a wasteful signal output operation caused due to overlapping of the scanning signals between rows adjacent each other in terms of time can be reduced, and electric power consumed in generation of the scanning signals can be decreased.

In each of the application examples, the description has been given as to the case where the shift register circuit and its drive control method according to the present invention are applied for the scanning driver in the image display apparatus (a liquid crystal display apparatus, an EL display apparatus or the like). However, the present invention is not restricted thereto. In short, the shift register circuit and the drive control apparatus according to the present invention sequentially output a signal at a predetermined timing (cycle). Therefore, it is good enough for the shift register circuit and the drive control apparatus to sequentially select each functional element (a load such as a display pixel) arranged in a matrix form as described above at a predetermined timing and set (scan) it to the drive state, and they can be excellently applied as, e.g., a scanning driver in an image read apparatus including a sensor array (a read pixel array) constructed by a plurality of photosensors (read pixels) having a thin film transistor.

What is claimed is:
1. A shift register circuit comprising:
   a plurality of cascade-connected signal holding circuits, each of the signal holding circuits comprising:
      an input control circuit to which an input signal is applied, and which fetches and holds the input signal;
      an output control circuit to which a first control clock signal is applied, and which outputs an output signal corresponding to timings of the held input signal and the first control clock signal;
      a transfer control circuit to which a second control clock signal is applied, and which outputs a shift signal corresponding to timings of the input signal held in the input control circuit and the second control clock signal, and supplies the shift signal as the input signal to the signal holding circuit on a next stage; and a reset control circuit to which a reset signal is applied, and which initializes a signal level of the input signal held in the input control circuit, wherein each of the first control clock signal and the second control clock signal has a first signal level and a second signal level which are different from each other, wherein a signal width in which the first control clock signal changes to the first signal level is the same as or shorter than a signal width in which the second control clock signal changes to the first signal level, wherein the first control clock signal is set to change from the first signal level to the second signal level prior to a timing at which the second control clock signal changes from the first signal level to the second signal level, and wherein a timing at which the output signal is terminated is set to be ahead of an application start timing of the reset signal.

2. The shift register circuit according to claim 1, wherein the output signal is output from the output control circuit in accordance with a timing at which the first control clock signal is set to the first signal level, and wherein the signal level of the first control clock signal is set to change to the second signal level prior to a start timing of an operation which initializes the signal level of the input signal held in the input control circuit by the reset control circuit.

3. The shift register circuit according to claim 1, wherein the first control clock signal and the second control clock signal are supplied to the signal holding circuits on odd-numbered stages of the signal holding circuits on the plurality of stages, and wherein a third control clock signal and a fourth control clock signal respectively having reversal phases of those of the first control clock signal and the second control clock signal are supplied to the signal holding circuits on even-numbered stages of the signal holding circuits on the plurality of stages.

4. The shift register circuit according to claim 1, wherein the shift signal generated by the transfer control circuit of the signal holding circuit on the next stage is input as the reset signal in the reset control circuit.

5. The shift register circuit according to claim 4, wherein the reset signal is input at a timing where a phase reversed from that of the second control clock signal is provided.

6. The shift register circuit according to claim 1, wherein the input control circuit comprises a first switch circuit which has a first end side of a current path, a control terminal to which the input signal is supplied, and a second end side connected with a first contact point, wherein the output control circuit comprises a second switch circuit and a third switch circuit, the second switch circuit having a first end side of a current path to which the first control clock signal is supplied, a second end side connected with a second contact point from which the output signal is output, and a control terminal connected with the first contact point, and the third switch circuit having a first end side of a current path connected with a power supply voltage side, a second end side connected with the second contact point, and a control terminal to which a reversal potential of a potential of the first contact point is applied, wherein the reset control circuit comprises a fourth switch circuit which has a first end side of a current path connected with the first contact point, a second end side connected with the power supply voltage, and a control terminal to which the reset signal is supplied, and wherein the transfer control circuit comprises a fifth switch circuit and a sixth switch circuit, the fifth switch circuit having a first end side of a current path to which the second control clock signal is supplied, a second end side connected with a third contact point from which the shift signal is output, and a control terminal connected with the first contact point, and the sixth switch circuit having a first end side of a current path connected with the power supply voltage side, a second end side connected with the third contact point, and a control terminal to which the reversal potential of the potential of the first contact point is applied.

7. The shift register circuit according to claim 6, wherein, in the output control circuit, the second switch circuit is turned on and the output signal is output through the second contact point at least in an output period alone of the output signal, and wherein the third switch circuit is turned on and the output signal is output through the second contact point in a non-output period of the output signal.

8. The shift register circuit according to claim 1, wherein each of the signal holding circuits comprises a plurality of switch circuits, each of which includes a field-effect type transistor having a single channel polarity.

9. The shift register circuit according to claim 8, wherein the field-effect transistor includes a thin film transistor using a semiconductor material including amorphous silicon.

10. The shift register circuit according to claim 8, wherein the field-effect transistor includes a thin film transistor using a semiconductor material including zinc oxide.

* * * * *